US012744104B2

(12) United States Patent
Ayyapureddi

(10) Patent No.: US 12,744,104 B2

(45) Date of Patent: Sep. 22, 2026

(54) APPARATUSES, SYSTEMS, AND METHODS FOR STORING MEMORY METADATA

(71) Applicant: Micron Technology, Inc., Boise, ID (US)

(72) Inventor: Sujeet Ayyapureddi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/430,406

(22) Filed: Feb. 1, 2024

(65) Prior Publication Data

US 2024/0274223 A1 Aug. 15, 2024

Related U.S. Application Data

(60) Provisional application No. 63/484,116, filed on Feb. 9, 2023.

(51) Int. Cl.
*G11C 29/00* (2006.01)

(52) U.S. Cl.
CPC ............ *G11C 29/76* (2013.01); *G11C 29/789* (2013.01)

(58) Field of Classification Search
CPC .................. G11C 29/76; G11C 29/789; G11C 2029/0411; G11C 29/24; G11C 29/26; G11C 29/42; G11C 29/44
See application file for complete search history.

(56) References Cited

U.S. PATENT DOCUMENTS 5,177,705 A 1/1993 Mcelroy et al.
5,299,164 A 3/1994 Takeuchi et al.
5,333,274 A 7/1994 Amini et al.
5,434,814 A 7/1995 Cho et al.
6,249,476 B1 6/2001 Yamazaki et al.
7,117,421 B1 10/2006 Danilak
(Continued)

FOREIGN PATENT DOCUMENTS

WO 2016048634 A1 3/2016
WO 2024107367 A1 5/2024
(Continued)

OTHER PUBLICATIONS

Chen et al., "CATCAM: Constant-time Alteration Ternary CAM with Scalable In-Memory Architecture"; 2020 53rd Annual IEEE/ACM International Symposium on Microarchitecture (Micro), Athens, Green; Oct. 17-21, 2020; pp. 342-355.
(Continued)

*Primary Examiner* — Mohammed A Bashar
(74) *Attorney, Agent, or Firm* — Dorsey & Whitney LLP

(57) ABSTRACT

A bank of a memory device may be divided into column planes. Each column plane may be associated with column selects. In some examples, a portion of a column plane associated with one column select may be used to store metadata associated with data of the remaining column selects. In some examples, the metadata may be mapped to the data based on a portion of a column address. In some examples, whether the memory device provides metadata responsive to a column address may be based on a value stored in a mode register. In some examples, the portion of the column plane associated with the one column select associated with metadata may also store error correction code data associated with the data of the remaining column selects.

20 Claims, 10 Drawing Sheets

(56) References Cited

U.S. PATENT DOCUMENTS 8,891,313 B2 11/2014 Chang et al.
9,158,617 B2 10/2015 Cho et al.
9,195,537 B2 11/2015 Sharon et al.
9,201,728 B2 12/2015 Patapoutian et al.
9,361,960 B2 6/2016 Vogelsang
9,547,550 B1 1/2017 Thakore et al.
9,607,679 B1 3/2017 Kim et al.
9,666,291 B2 5/2017 Park
9,880,901 B2 1/2018 Zastrow
9,996,799 B2 6/2018 Bostick et al.
10,127,101 B2 11/2018 Halbert et al.
10,222,989 B1 3/2019 Zitlaw
10,243,590 B1 3/2019 Seshadri
10,810,079 B2 10/2020 Halbert et al.
10,817,371 B2 10/2020 Rooney et al.
10,872,011 B2 12/2020 Bains et al.
10,929,033 B2 2/2021 Meeker et al.
10,937,517 B1 3/2021 Rich-Plotkin et al.
10,963,336 B2 3/2021 Veches
11,010,304 B2 5/2021 Kang et al.
11,074,126 B2 7/2021 Prather et al.
11,088,710 B2 8/2021 Lee et al.
11,177,012 B1 11/2021 Avraham et al.
11,200,961 B1 12/2021 Uribe
11,264,085 B1 3/2022 Ware et al.
11,538,515 B2 12/2022 Ji et al.
11,579,971 B2 2/2023 Ayyapureddi
11,580,038 B2 2/2023 Norman et al.
11,615,861 B2 3/2023 Kim et al.
11,830,570 B2 11/2023 Laurent et al.
11,837,316 B1 12/2023 Smith et al.
12,001,707 B2 6/2024 Boehm et al.
12,014,797 B2 6/2024 Ayyapureddi
12,019,513 B2 6/2024 Ayyapureddi
12,095,474 B1 9/2024 Zhu et al.
12,204,410 B2 1/2025 Sutera et al.
12,204,770 B2 1/2025 Ayyapureddi
12,230,347 B2 2/2025 Suh et al.
12,249,393 B2 3/2025 Reohr
12,299,291 B2 5/2025 Eilert et al.
12,475,965 B2 11/2025 Smith et al.
12,488,853 B2 12/2025 Smith et al.
12,511,191 B2 12/2025 Ayyapureddi et al.
12,512,176 B2 12/2025 Smith et al.
12,524,298 B2 1/2026 Ayyapureddi
12,524,306 B2 1/2026 Ayyapureddi
12,530,261 B2 1/2026 Ayyapureddi et al.
12,536,096 B2 1/2026 Ayyapureddi
12,541,425 B2 2/2026 Ayyapureddi et al.
12,541,429 B2 2/2026 Ayyapureddi
2003/0081492 A1 5/2003 Farrell et al.
2003/0117838 A1 6/2003 Hidaka
2005/0226070 A1 10/2005 Ohsawa
2006/0233030 A1 10/2006 Choi
2008/0089129 A1 4/2008 Lee
2008/0313493 A1 12/2008 Roohparvar et al.
2009/0097348 A1 4/2009 Minzoni et al.
2009/0132876 A1 5/2009 Freking et al.
2009/0168523 A1 7/2009 Shirakawa et al.
2009/0196103 A1 8/2009 Kim et al.
2010/0177582 A1 7/2010 Kim et al.
2010/0177587 A1 7/2010 Huang
2010/0290146 A1 11/2010 Lam
2011/0154158 A1 6/2011 Yurzola et al.
2012/0092940 A1 4/2012 Chang et al.
2013/0117630 A1 5/2013 Kang
2013/0275709 A1 10/2013 Gajapathy
2014/0126300 A1 5/2014 Takahashi et al.
2015/0193464 A1 7/2015 Kwon et al.
2015/0262631 A1 9/2015 Shimizu
2016/0070507 A1 3/2016 Hoshikawa et al.
2016/0092307 A1 3/2016 Bonen et al.
2016/0125920 A1 5/2016 Kim et al.
2016/0307645 A1 10/2016 Kim et al.
2016/0365131 A1 12/2016 Kim et al.
2017/0060681 A1 3/2017 Halbert et al.
2017/0062067 A1 3/2017 Yang et al.
2017/0091025 A1 3/2017 Ahn et al.
2017/0192843 A1 7/2017 Warnes et al.
2017/0249097 A1 8/2017 Eguchi
2017/0269992 A1 9/2017 Bandic et al.
2017/0285990 A1 10/2017 Chen et al.
2017/0286213 A1 10/2017 Li
2017/0344423 A1 11/2017 Hsiao et al.
2018/0025760 A1 1/2018 Mazumder et al.
2018/0121283 A1 5/2018 Plants
2018/0150350 A1 5/2018 Cha et al.
2018/0301203 A1 10/2018 Kim
2019/0066816 A1 2/2019 Dono
2019/0073261 A1 3/2019 Halbert et al.
2019/0103154 A1 4/2019 Cox et al.
2019/0197171 A1 6/2019 Tiwari et al.
2019/0206478 A1 7/2019 Jun
2019/0362792 A1 11/2019 Oh et al.
2019/0369893 A1 12/2019 Ross
2019/0371403 A1 12/2019 Maejima
2020/0019462 A1 1/2020 Prather et al.
2020/0051616 A1 2/2020 Cho
2020/0104205 A1 4/2020 Noguchi et al.
2020/0104208 A1 4/2020 Heo et al.
2020/0194050 A1 6/2020 Akamatsu
2020/0226039 A1 7/2020 Lee
2020/0321060 A1 10/2020 Lang et al.
2020/0373941 A1 11/2020 Latorre et al.
2021/0011645 A1 1/2021 Martinelli et al.
2021/0012817 A1 1/2021 Laurent et al.
2021/0012849 A1 1/2021 Kim et al.
2021/0057003 A1 2/2021 Prather et al.
2021/0064119 A1 3/2021 Mirichigni et al.
2021/0064282 A1 3/2021 He et al.
2021/0064461 A1 3/2021 Veches
2021/0064467 A1 3/2021 Buerkle et al.
2021/0083687 A1 3/2021 Lee et al.
2021/0142848 A1 5/2021 Lim et al.
2021/0142860 A1 5/2021 Song et al.
2021/0200630 A1 7/2021 Ishikawa et al.
2021/0208967 A1 7/2021 Cha et al.
2021/0224155 A1 7/2021 Bains et al.
2021/0247910 A1 8/2021 Kim et al.
2021/0272627 A1* 9/2021 Lee .................... G11C 13/0028
2021/0294692 A1 9/2021 Chen
2021/0311821 A1 10/2021 Ryu et al.
2021/0311822 A1 10/2021 Jannusch et al.
2021/0311830 A1 10/2021 Lee
2021/0357287 A1 11/2021 Kim et al.
2021/0358559 A1 11/2021 Suh et al.
2021/0365316 A1 11/2021 Nale et al.
2021/0406123 A1 12/2021 Nakanishi et al.
2022/0027090 A1 1/2022 Kwon et al.
2022/0035529 A1 2/2022 Bennett
2022/0084565 A1 3/2022 Prather et al.
2022/0091938 A1 3/2022 Buerkle et al.
2022/0129196 A1 4/2022 Roberts et al.
2022/0138065 A1 5/2022 Secatch et al.
2022/0197739 A1 6/2022 Ryu et al.
2022/0261310 A1 8/2022 Ishikawa et al.
2022/0334917 A1 10/2022 Veches
2022/0337271 A1 10/2022 Hanna
2022/0365692 A1 11/2022 Vankamamidi et al.
2022/0398042 A1 12/2022 Song et al.
2022/0415398 A1 12/2022 Lien et al.
2023/0009642 A1 1/2023 Eilert et al.
2023/0146549 A1 5/2023 Lien et al.
2023/0161665 A1 5/2023 Choi et al.
2023/0185665 A1 6/2023 Ayyapureddi
2023/0223096 A1 7/2023 Bains et al.
2023/0236747 A1 7/2023 Curewitz et al.
2023/0289072 A1 9/2023 Cho et al.
2023/0298682 A1 9/2023 Suh et al.
2023/0315571 A1 10/2023 Sutera et al.
2023/0350581 A1 11/2023 Ayyapureddi
2023/0350748 A1 11/2023 Ayyapureddi
2023/0352064 A1 11/2023 Ayyapureddi
2023/0352112 A1 11/2023 Ayyapureddi

(56) References Cited

U.S. PATENT DOCUMENTS

| | | | | |
|---|---|---|---|---|
| 2024/0004754 | A1 | 1/2024 | Veches | |
| 2024/0029781 | A1 | 1/2024 | Schreck et al. | |
| 2024/0079074 | A1 | 3/2024 | Bak et al. | |
| 2024/0086520 | A1 | 3/2024 | Kaplan et al. | |
| 2024/0096404 | A1 | 3/2024 | Cho et al. | |
| 2024/0126438 | A1* | 4/2024 | Suh | G06F 3/061 |
| 2024/0160351 | A1 | 5/2024 | Ayyapureddi et al. | |
| 2024/0160524 | A1 | 5/2024 | Ayyapureddi et al. | |
| 2024/0160527 | A1 | 5/2024 | Ayyapureddi et al. | |
| 2024/0161855 | A1 | 5/2024 | Smith et al. | |
| 2024/0161856 | A1 | 5/2024 | Smith et al. | |
| 2024/0161859 | A1 | 5/2024 | Ayyapureddi et al. | |
| 2024/0170088 | A1 | 5/2024 | Smith et al. | |
| 2024/0176699 | A1 | 5/2024 | Ayyapureddi et al. | |
| 2024/0177794 | A1 | 5/2024 | Vogelsang | |
| 2024/0220142 | A1 | 7/2024 | Park | |
| 2024/0220149 | A1 | 7/2024 | Kim et al. | |
| 2024/0248796 | A1 | 7/2024 | Ayyapureddi | |
| 2024/0256380 | A1 | 8/2024 | Ayyapureddi | |
| 2024/0256382 | A1 | 8/2024 | Ayyapureddi | |
| 2024/0272979 | A1 | 8/2024 | Ayyapureddi | |
| 2024/0272984 | A1 | 8/2024 | Ayyapureddi | |
| 2024/0273014 | A1 | 8/2024 | Ayyapureddi | |
| 2024/0281327 | A1 | 8/2024 | Ayyapureddi et al. | |
| 2024/0289266 | A1 | 8/2024 | Ayyapureddi | |
| 2024/0321328 | A1 | 9/2024 | Ayyapureddi | |
| 2024/0377952 | A1 | 11/2024 | Song et al. | |
| 2024/0394178 | A1 | 11/2024 | Partsch | |
| 2024/0419538 | A1 | 12/2024 | Huang et al. | |
| 2025/0077103 | A1 | 3/2025 | Ayyapureddi | |
| 2025/0077424 | A1 | 3/2025 | Ayyapureddi | |
| 2025/0078906 | A1 | 3/2025 | Kim et al. | |
| 2025/0078949 | A1 | 3/2025 | Ayyapureddi | |
| 2025/0078950 | A1 | 3/2025 | Ayyapureddi | |
| 2025/0110643 | A1 | 4/2025 | Ayyapureddi | |
| 2025/0110825 | A1 | 4/2025 | Ayyapureddi | |
| 2025/0110830 | A1 | 4/2025 | Ayyapureddi | |
| 2025/0111887 | A1 | 4/2025 | Ayyapureddi | |
| 2025/0112643 | A1 | 4/2025 | Ayyapureddi | |
| 2025/0123924 | A1 | 4/2025 | Ayyapureddi et al. | |
| 2025/0138940 | A1 | 5/2025 | Cho et al. | |
| 2025/0156087 | A1 | 5/2025 | Ayyapureddi | |
| 2025/0165160 | A1 | 5/2025 | Eilert et al. | |

FOREIGN PATENT DOCUMENTS

| | | | |
|---|---|---|---|
| WO | 2024107503 | A1 | 5/2024 |
| WO | 2024107504 | A1 | 5/2024 |
| WO | 2024167711 | A1 | 8/2024 |
| WO | 2025053912 | A1 | 3/2025 |
| WO | 2025075696 | A1 | 4/2025 |
| WO | 2025075697 | A1 | 4/2025 |

OTHER PUBLICATIONS

J. F. Philippe Marchand "An Alterable Programmable Logic Array"; IEEE Journal of Solid-State Circuits, vol. sc-20, No. 5, Oct. 1985; pp. 1061-1066.

U.S. Appl. No. 19/025,934, titled "Apparatuses, Systems, and Methods for Managing Metadata Security and Access" filed Jan. 16, 2025, pp. all pages of application as filed.

U.S. Appl. No. 18/441,775 titled "Apparatuses and Methods for Settings for Adjustable Write Timing" filed Feb. 14, 2024, pp. all pages of the application as filed.

U.S. Appl. No. 18/441,830 titled "Apparatuses, Systems, and Methods for Storing and Accessing Memory Metadata and Error Correction Code Data" filed Feb. 14, 2024, pp. all pages of the application as filed.

U.S. Appl. No. 18/734,189, titled "Apparatuses, Systems, and Methods for Managing Metadata Storage at a Memory" filed Jun. 5, 2024, pp. all pages of application as filed.

U.S. Appl. No. 18/743,994 titled "Apparatuses and Methods for Shared Codeword in 2-Pass Access Operations" filed Jun. 14, 2024, pp. all pages of the application as filed.

U.S. Appl. No. 18/745,577 titled "Apparatuses and Methods for Half-Page Modes of Memory Devices" filed Jun. 17, 2024, pp. all pages of the application as filed.

U.S. Appl. No. 18/745,843 titled "Apparatuses and Methods for Half-Page Modes of Memory Devices" filed Jun. 17, 2024, pp. all pages of the application as filed.

U.S. Appl. No. 18/745,877 titled "Apparatuses and Methods for Half-Page Modes of Memory Devices" filed Jun. 17, 2024, pp. all pages of the application as filed.

U.S. Appl. No. 18/745,894 titled "Apparatuses and Methods for Half-Page Modes of Memory Devices" filed Jun. 17, 2024, pp. all pages of the application as filed.

U.S. Appl. No. 18/747,658, titled "Apparatuses and Methods for Bounded Fault Compliant Metadata Storage" filed, pp. all pages of application as filed.

U.S. Appl. No. 18/747,676, titled "Apparatuses and Methods for Alternate Memory Die Metadata Storage", filed Jun. 19, 2024, pp. all pages of application as filed.

U.S. Appl. No. 18/747,696, titled "Apparatuses and Methods for Scalable 1-Pass Error Correction Code Operations", filed Jun. 19, 2024, pp. all pages of application as filed.

U.S. Appl. No. 18/747,712, titled "Apparatuses and Methods for Granular Single-Pass Metadata Access Operations" filed Jun. 19, 2024, pp. all pages of application as filed.

U.S. Appl. No. 18/747,635, titled "Apparatuses and Methods for Read/Modify/Write Single-Pass Metadata Access Operations" filed Jun. 19, 2024, pp. all pages of application as filed.

Lumenci Team "High Bandwidth Memory (HBM3)" https://lumenci.com/blogs/high-bandwidth-memory; Editorial Team at Lumenci, Jul. 14, 2022; pp. 1-3.

PCT Application No. PCT/US24/39192 titled "Apparatuses and Methods for Scalable 1-Pass Error Correction Code Operations" filed Jul. 23, 2024, pp. all pages of the application as filed.

PCT Application No. PCT/US24/39195 titled "Apparatuses and Methods for Half-Page Modes of Memory Devices" filed Jul. 23, 2024, pp. all pages of the application as filed.

PCT Application No. PCT/US24/39231 titled "Apparatuses and Methods for Granular Single-Pass Metadata Access Operations" filed Jul. 24, 2024, pp. all pages of the application as filed.

U.S. Appl. No. 18/625,539, titled "Apparatuses, Systems, and Methods for Per Row Error Scrub Information" filed Apr. 3, 2024, pp. all pages of application as filed.

U.S. Appl. No. 19/360,159 titled "Apparatuses and Methods for Enhanced Metadata Support" filed Oct. 16, 2025; pp. all pages of the application as filed.

U.S. Appl. No. 19/366,908 titled "Apparatuses and Methods for Configurable ECC Modes", filed Oct. 23, 2025; pp. all pages of application as filed.

U.S. Appl. No. 19/376,027 titled "Apparatuses and Methods for Single-Pass Access of ECC Information, Metadata Information or Combinations Thereof", filed Oct. 31, 2025; pp. all pages of application as filed.

U.S. Appl. No. 19/381,448 titled "Apparatuses and Methods for Enhanced Metadata Support", filed Nov. 6, 2025; pp. all pages of application as filed.

U.S. Appl. No. 19/431,541, titled "Apparatuses and Methods for Bounded Fault Compliant Metadata Storage" filed Dec. 23, 2025, pp. all pages of application as filed.

U.S. Appl. No. 19/435,124 titled "Apparatuses, Systems, and Methods for Storing Memory Metadata", filed Dec. 29, 2025; pp. all page of the application as filed.

U.S. Appl. No. 19/441,648, titled "Apparatuses, Systems, and Methods for Storing and Accessing Memory Metadata and Error Correction Code Data" filed Jan. 6, 2026; pp. all pages of application as filed.

Handy, Jim, "Emerging Memories Today: Understanding Bit Selectors", The Memory Guy Blog, Objective Analysis on Semiconductor Memories, Nov. 2018, 5 pgs.

(56) References Cited

OTHER PUBLICATIONS

PCT Application No. PCT/US23/76430 titled "Apparatuses and Methods for Separate Write Enable for Single-Pass Access of Data, Metadata, and Parity Information" filed Oct. 10, 2023, pp. all pages of application as filed.
PCT Application No. PCT/US23/76433 titled "Apparatuses and Methods for Single-Pass Access of ECC Information, Metadata Information or Combinations Thereof" filed Oct. 10, 2023; pp. all pages of application as filed.
PCT Application No. PCT/US24/13516, titled "Apparatuses, Systems, and Methods for Storing Memory Metadata" filed Jan. 30, 2024; pp. all pages of application as filed.
U.S. Appl. No. 17/730,381, titled "Apparatuses, Systems, and Methods for Per Row Error Scrub Information", filed Apr. 27, 2022; pp. all pages of application as filed.
U.S. Appl. No. 17/731,024, titled "Apparatuses, Systems, and Methods for Managing Metadata Storage at a Memory", filed Apr. 27, 2022; pp. all pages of the application as filed.
U.S. Appl. No. 18/424,282 titled "Apparatuses and Methods for Bounded Fault Compliant Metadata Storage" filed Jan. 26, 2024; pp. all pages of application as filed.
U.S. Appl. No. 18/424,342 titled "Apparatuses and Methods for Bounded Fault Compliant Metadata Storage" filed Jan. 26, 2024; pp. all pages of application as filed.
U.S. Appl. No. 18/430,381, titled "Apparatuses, Systems, and Methods for Storing Memory Metadata", filed Feb. 1, 2024; pp. all pages of application as filed.
U.S. Appl. No. 18/430,406, titled "Apparatuses, Systems, and Methods for Storing Memory Metadata", filed Feb. 1, 2024; pp. all pages of application as filed.
U.S. Appl. No. 18/431,232, titled "Apparatuses, Systems, and Methods for Storing Memory Metadata", filed Feb. 2, 2024; pp. all pages of application as filed.
U.S. Appl. No. 18/431,306, titled "Apparatuses, Systems, and Methods for Storing Memory Metadata", filed Feb. 2, 2024; pp. all pages of application as filed.
U.S. Appl. No. 18/504,215 titled "Apparatuses and Methods for Enhanced Metadata Support" filed Nov. 8, 2023; pp. all pages of application as filed.
U.S. Appl. No. 18/504,234 titled "Apparatuses and Methods for Enhanced Metadata Support" filed Nov. 8, 2023; pp. all pages of application as filed.
U.S. Appl. No. 18/504,316 titled "Apparatuses and Methods for Configurable ECC Modes" filed Nov. 8, 2023; all pages of application as filed.
U.S. Appl. No. 18/504,324 titled "Apparatuses and Methods for Single-Pass Access of ECC Information, Metadata Information or Combinations Thereof", filed Nov. 8, 2023, all pages of application as filed.
U.S. Appl. No. 18/504,342 titled "Apparatuses and Methods for Single-Pass Access of ECC Information,Metadata Information or Combinations Thereof" filed Nov. 8, 2023; pp. all pages of application as filed.
U.S. Appl. No. 18/504,353 titled "Apparatuses and Methods for Separate Write Enable for Single-Pass Accessof Data, Metadata, and Parity Information" filed Nov. 8, 2023; pp. all pages of application as filed.
U.S. Appl. No. 18/504,362 titled "Apparatuses and Methods for Separate Write Enable for Single-Pass Access of Data, Metadata, and Parity Information" filed Nov. 8, 2023; pp. all pages of application as filed.
U.S. Appl. No. 17/730,396, titled "Apparatuses, Systems, and Methods for Per Row Error Scrub Information Registers", filed Apr. 27, 2022; pp. all pages of application as filed.
U.S. Appl. No. 17/730,992 titled "Mode Register for Blocking Direct Access to Meta Data" filed Apr. 27, 2022, pp. all pages of application as filed.
U.S. Appl. No. 17/731,024 titled "Apparatuses, Systems, and Methods for Managing Metadata Storage at a Memory" filed Apr. 27, 2022, KNE.
U.S. Appl. No. 17/730,992 titled "Apparatuses, Systems, and Methods for Managing Metadata Security and Access" filed Apr. 27, 2022, KNE.
U.S. Appl. No. 19/731,515, titled "Apparatuses, Systems, and Methods for Storing Memory Metadata", filed Jul. 6, 2026, pp. all pages of application as filed.
U.S. Appl. No. 19/744,005, titled "Apparatuses, Systems, and Methods for Storing Memory Metadata", filed Jul. 16, 2026, pp. all pages of application as filed.

* cited by examiner

| CA<9:4> | | | | x8 1 bit | | |
|---|---|---|---|---|---|---|
| Start | End | Col Plane | MD Bit | Start CS | End CS | CS [CP] |
| 000 000 | 000 111 | Addr<9:7> | Addr<6:4> | 0 | 7 | 63[0] |
| 001 000 | 001 111 | Addr<9:7> | Addr<6:4> | 8 | 15 | 63[1] |
| 010 000 | 010 111 | Addr<9:7> | Addr<6:4> | 16 | 23 | 63[2] |
| 011 000 | 011 111 | Addr<9:7> | Addr<6:4> | 24 | 31 | 63[3] |
| 100 000 | 100 111 | Addr<9:7> | Addr<6:4> | 32 | 39 | 63[4] |
| 101 000 | 101 111 | Addr<9:7> | Addr<6:4> | 40 | 47 | 63[5] |
| 110 000 | 110 111 | Addr<9:7> | Addr<6:4> | 48 | 55 | 63[6] |
| 111 000 | 110 110 | Addr<9:7> | Addr<6:4> | 56 | 62 | 63[7] |

500

CA<10:4>
Used as CA<9,8,10,7,6:4>

502

| | | <9,8,10,7> | <6,5,4> | x4 1 bit | | |
|---|---|---|---|---|---|---|
| Start | End | Col Plane | MD Bit | Start | End | CS [CP] |
| 0000 000 | 0000 111 | 0000 | Addr<6:4> | 0 | 7 | 63[0] |
| 0001 000 | 0001 111 | 0001 | Addr<6:4> | 8 | 15 | 63[1] |
| 0010 000 | 0010 111 | 0100 | Addr<6:4> | 16 | 23 | 63[4] |
| 0011 000 | 0011 111 | 0101 | Addr<6:4> | 24 | 31 | 63[5] |
| 0100 000 | 0100 111 | 1000 | Addr<6:4> | 32 | 39 | 63[8] |
| 0101 000 | 0101 111 | 1001 | Addr<6:4> | 40 | 47 | 63[9] |
| 0110 000 | 0110 111 | 1100 | Addr<6:4> | 48 | 55 | 63[12] |
| 0111 000 | 0110 110 | 1101 | Addr<6:4> | 56 | 62 | 63[13] |
| 1000 000 | 1000 111 | 0010 | Addr<6:4> | 0 | 7 | 63[2] |
| 1001 000 | 1001 111 | 0011 | Addr<6:4> | 8 | 15 | 63[3] |
| 1010 000 | 1010 111 | 0110 | Addr<6:4> | 16 | 23 | 63[6] |
| 1011 000 | 1011 111 | 0111 | Addr<6:4> | 24 | 31 | 63[7] |
| 1100 000 | 1100 111 | 1010 | Addr<6:4> | 32 | 39 | 63[10] |
| 1101 000 | 1101 111 | 1011 | Addr<6:4> | 40 | 47 | 63[11] |
| 1110 000 | 1110 111 | 1110 | Addr<6:4> | 48 | 55 | 63[14] |
| 1111 000 | 1110 110 | 1111 | Addr<6:4> | 56 | 62 | 63[15] |

Column Addresses (CA) | CP Storing MD | Location in CP of MD Bit | CS of Data | CP of Metadata Metadata Address

FIG. 5

APPARATUSES, SYSTEMS, AND METHODS FOR STORING MEMORY METADATA

CROSS-REFERENCE TO RELATED APPLICATIONS

This application claims the filing benefit of U.S. Provisional Application No. 63/484,116, filed Feb. 9, 2023. This application is incorporated by reference herein in its entirety and for all purposes.

BACKGROUND

This disclosure relates generally to semiconductor devices, and more specifically to semiconductor memory devices. In particular, the disclosure relates to memory, such as dynamic random access memory (DRAM). Information may be stored in memory cells, which may be organized into rows (word lines) and columns (bit lines) of an array. Various types of information may be stored in the array, such as data, error correction code (ECC) data, and metadata. The ECC data may provide information that may be used to detect and/or correct errors in the data. The metadata may provide information about the regular data, ECC data, the memory device, and/or a device in communication with the memory device (e.g., a controller).

While demand for metadata has increased, many DRAM users are sensitive to losing array space for storing user data. Accordingly, techniques for efficiently storing metadata to preserve array space for user data is desired.

BRIEF DESCRIPTION OF THE DRAWINGS

FIG. 5 is an example of a mapping of metadata to data according to an embodiment of the present disclosure.

DETAILED DESCRIPTION

Figure 1:
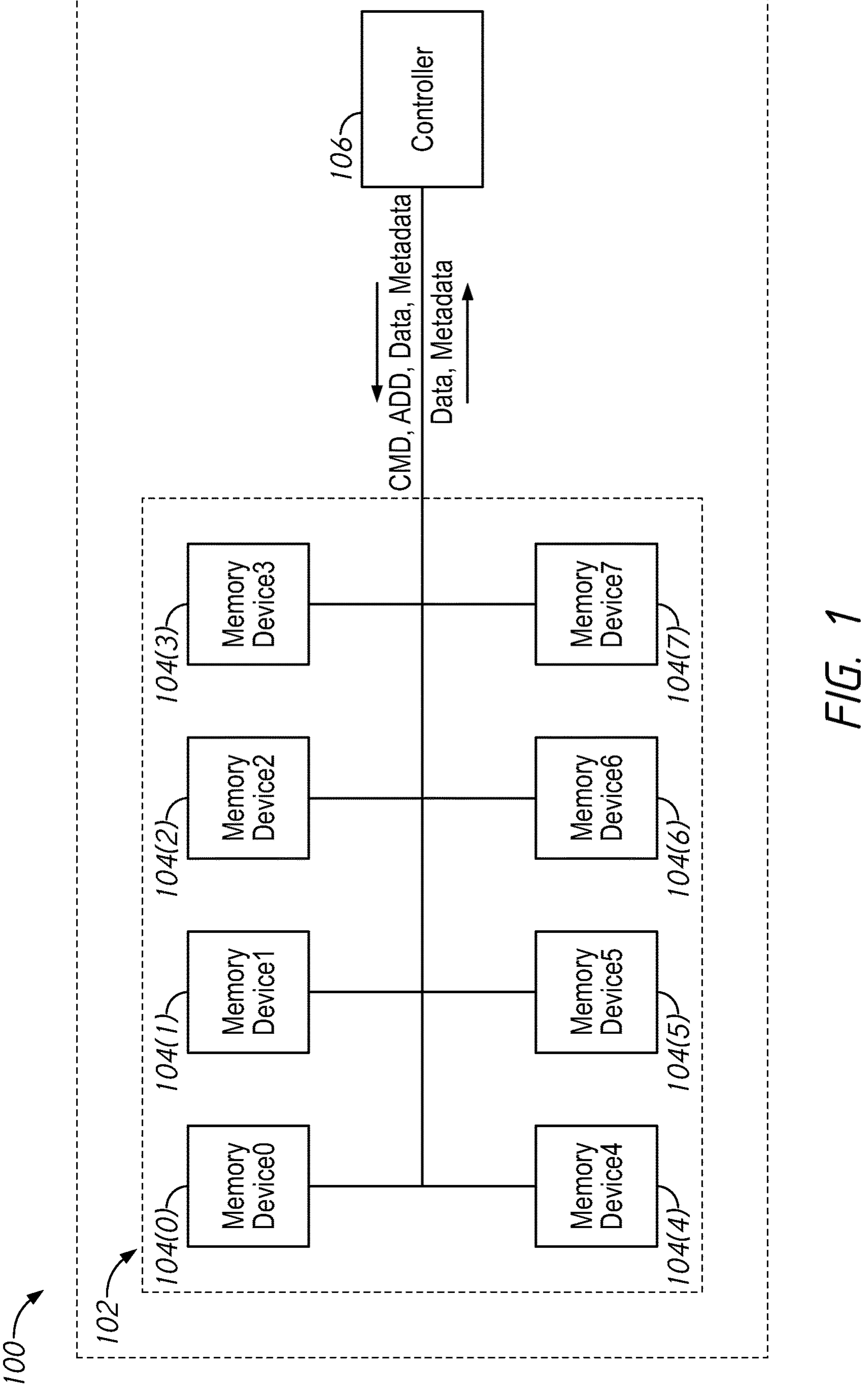
FIG. 1 is a block diagram of at least a portion of a computing system according to some embodiments of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Semiconductor memory devices may store information in multiple memory cells. The information may be stored as a binary code, and each memory cell may store a single bit of information as either a logical high (e.g., a "1") or a logical low (e.g., a "0"). The memory cells may be organized at the intersection of word lines (rows) and bit lines (columns) an array. The memory may further be organized into one or more memory banks. The banks may be organized into bank groups, where each bank group includes one or more banks. Each bank may include multiple of rows and columns. During operations, the memory device may receive a command and an address which specifies one or more rows and one or more columns and then execute the command on the memory cells at the intersection of the specified rows and columns (and/or along an entire row/column). The address may further specify the bank group and/or bank for execution of the command. In some applications, rows may be specified by 17-bit row addresses and columns may be specified by 12-bit column addresses. However, the number of bits used for the addresses may vary depending on the size and/or organization of the memory.

The columns may generally be organized into column planes, each of which includes a number of sets of individual columns all activated by a column select signal (CS). Each bank may include some number X column planes. A column plane may receive some number N of column select (CS) signals, each of which may activate some number M of individual bit lines. As used herein, a column select set or CS set may generally refer to a set of bit lines which are activated by a given value of the CS signal within a column plane. The column select signal may be represented by (all or a portion of) a column address (CA). Responsive to a column select signal, data may be provided from corresponding locations from the column planes. The data from the column planes associated with the column select signal may be referred to as a cache line.

In some embodiments, each bank of a memory array may include seventeen (X=17) column planes. In some embodiments, sixteen (16) column planes may be designated for data and one column plane may be designated for ECC data. Each column plane may receive sixty-four (N=64) CS signals, each of which may activate eight (M=8) bit lines. When a column select is activated, each column plane may provide eight bits, resulting in a prefetch of 128 bits (e.g., 8 bits×16 column planes), for example when operating in ×4 mode. Optionally, in some embodiments, one or more banks may include an additional column plane (X=18) for redundancy, which may be used for repairs, but the bits from the redundant column plane "replace" the bits from a damaged column plane, resulting in a same prefetch. In embodiments where the memory array includes an additional column plane for ECC data, the memory array may provide the cache line of data plus 8 bits of additional ECC data.

DRAM users are increasingly utilizing metadata to supplement the data stored in the memory array. For example, metadata may be used to store a "poison bit" that indicates that the data associated with the metadata is erroneous and should be discarded and/or replaced by an external device (e.g., controller, host, and/or system on a chip). In another example, metadata may store a pointer to a storage location that may allow the external device to determine what location in the array to access the next associated data. In some applications, this may be analogous to a head and/or tail of a linked list. These are merely examples, and other uses of metadata are also possible.

While users are finding more applications for metadata, metadata must be stored somewhere on the memory device, typically in the memory array. Some users are sensitive to losing space to store "regular" user data in order to store metadata. These users may want to give up as little array density as possible while still utilizing metadata. In some applications, the user may only desire four bits of metadata, even for modules including eight DRAM devices. Further, addressing the metadata must be efficient to avoid increasing the time between an internal read and when the data is provided from the array (tAA).

According to embodiments of the present disclosure, portions of individual column planes may be used to store metadata. In some embodiments, one of the column select signals may be used to access metadata stored in the portions of the column planes. For example, column selects 0-62 may be used to access data in the column planes, and column select 63 may be used to access metadata in the column planes. In some embodiments, each column plane may store one or more bits of metadata (e.g., 1 bit, 4 bits, 8 bits). In some embodiments, one bit of metadata may be associated with each cache line (e.g., the data associated with one column select). In some embodiments, one or more bits of the column address used to access the data may be used to address the metadata to map the metadata to the associated data. In some embodiments, one or more bits of the column address may be used to determine whether the memory device provides the metadata.

In some embodiments all of the bits associated with a column select may not be necessary to store the metadata. Optionally, in these embodiments, the remaining space associated with the metadata column select may be used for storing additional ECC data. In some embodiments, this may allow the memory to provide not only single error correction but double error detection as well (SECDED). For example, 64 bits of 128 bits associated with a column select may be allocated to metadata and the remaining 64 bits may be allocated to additional ECC data. In some embodiments, the same bits of the column address used to address the metadata may be used to address the additional ECC data.

FIG. 1 is a block diagram of at least a portion of a computing system according to some embodiments of the present disclosure. The computing system 100 includes a memory module 102 and a controller 106 in communication with the memory module 102. In some embodiments, the controller 106 may be included in a processor (not shown) or in communication with the processor. The memory module 102 may include one or more memory devices 104. In the example shown in FIG. 1, there are eight memory devices 104(0-7). However, in other embodiments, there may be more or fewer memory devices. In some embodiments, additional memory devices 104 may be included to provide for redundancy. In some embodiments, memory module 102 may be a dual in-line memory module (DIMM). In some embodiments, what is shown in FIG. 1 may represent only half of the DIMM (e.g., one of the two channels).

The controller 106 may provide commands, addresses, and/or data (e.g., data, metadata, or both) to one or more of the memory devices 104 and receive data from one or more of the memory devices 104. In some embodiments, memory devices 104 may be ×4 or ×8 memory devices. That is, either four or eight DQ terminals (e.g., pins) may be active. In some embodiments, the memory devices 104 may support both ×4 and ×8 operation. In some embodiments, whether the memory devices 104 operate in ×4 or ×8 mode may be based, at least in part, on values stored in mode registers (not shown in FIG. 1) of the memory devices 104.

In some applications, each of the memory devices 104 may provide four bits of metadata, for a total of four bytes of data. Where memory density is a priority, according to embodiments of the present disclosure, each memory device 104 may provide one bit of metadata. In some applications, only four bits of metadata are desired. However, where memory module 102 includes eight memory devices 104, an addressing issue arises as each memory device 104 cannot store half a bit.

According to embodiments of the present disclosure, only certain ones of the memory devices 104 provide metadata based, at least in part, on a column address (e.g., CA<11:0>) provided by the controller 106. For example, when a portion of the column address is one value, memory devices 104 (0-3) may provide metadata, and when the certain portion of the column address is another value, memory devices 104 (4-7) may provide metadata. In some embodiments, which value of the portion of the column address for which the memory device 104 provides metadata may be based, at least in part, on a value stored in the mode register of the memory device 104. In some embodiments, the mode register may be programmed (e.g., written to) with the value by the controller 106. In some embodiments, the controller 106 may be configured to ignore metadata provided from one or more of the memory devices 104(0-7) based on the portion of the column address. In some examples, the portion of the column address may include CA10. Using a portion of the column address to determine which memory devices provide metadata and/or which metadata is ignored may reduce addressing and/or data management issues when a number of metadata bits desired is less than a total number of memory devices.

In some embodiments, whether or not metadata is stored at all may be based on a value stored in the mode register of the memory device 104. For example, when one value is stored in the mode register, metadata may be stored and provided as described herein. When another value is stored in the mode register, metadata may not be stored. When this value is stored, all of the column selects are available for providing data to and from the array. Thus, a same memory may be utilized for applications where metadata is desired and applications where metadata is not desired.

As will be described in more detail herein, memory device 104 may include a memory array including one or more banks organized into multiple column planes. Each of the column planes may be associated with multiple column selects. One of the column selects may be associated with metadata while the remaining column selects are associated with data. The metadata may be associated with the data (e.g., a pointer, poison bit, etc.). In order to properly associate the metadata stored in a location of the memory array with the data stored in another location of the memory array, the metadata may be mapped (e.g., assigned addresses) based on the column address of the data.

According to embodiments of the present disclosure, a portion of the column address may be used to generate a metadata address to map the metadata to the appropriate data. In some embodiments, the metadata address may be based on six bits or seven bits of the column address. In some embodiments, six bits may be used when the memory device 104 is configured to operate in ×8 mode and seven bits may be used when the memory device 104 is configured to operate in ×4 mode. In some embodiments, the address may be generated by the mode register. By using a portion of the column address, the metadata address may be efficiently generated. This may minimize impacts on tAA.

Optionally, in some embodiments, bits associated with the column select for the metadata that are not required to store metadata may be used to store ECC data. In some embodiments, the ECC data may be mapped to the corresponding data using some or all of the same bits of the column address as the metadata. In some applications, when the ECC data stored with the metadata is used with the ECC data stored in another column plane of the memory device 104, the memory device 104 may be able to provide not only single error correction but also double error detection.

Figure 2:
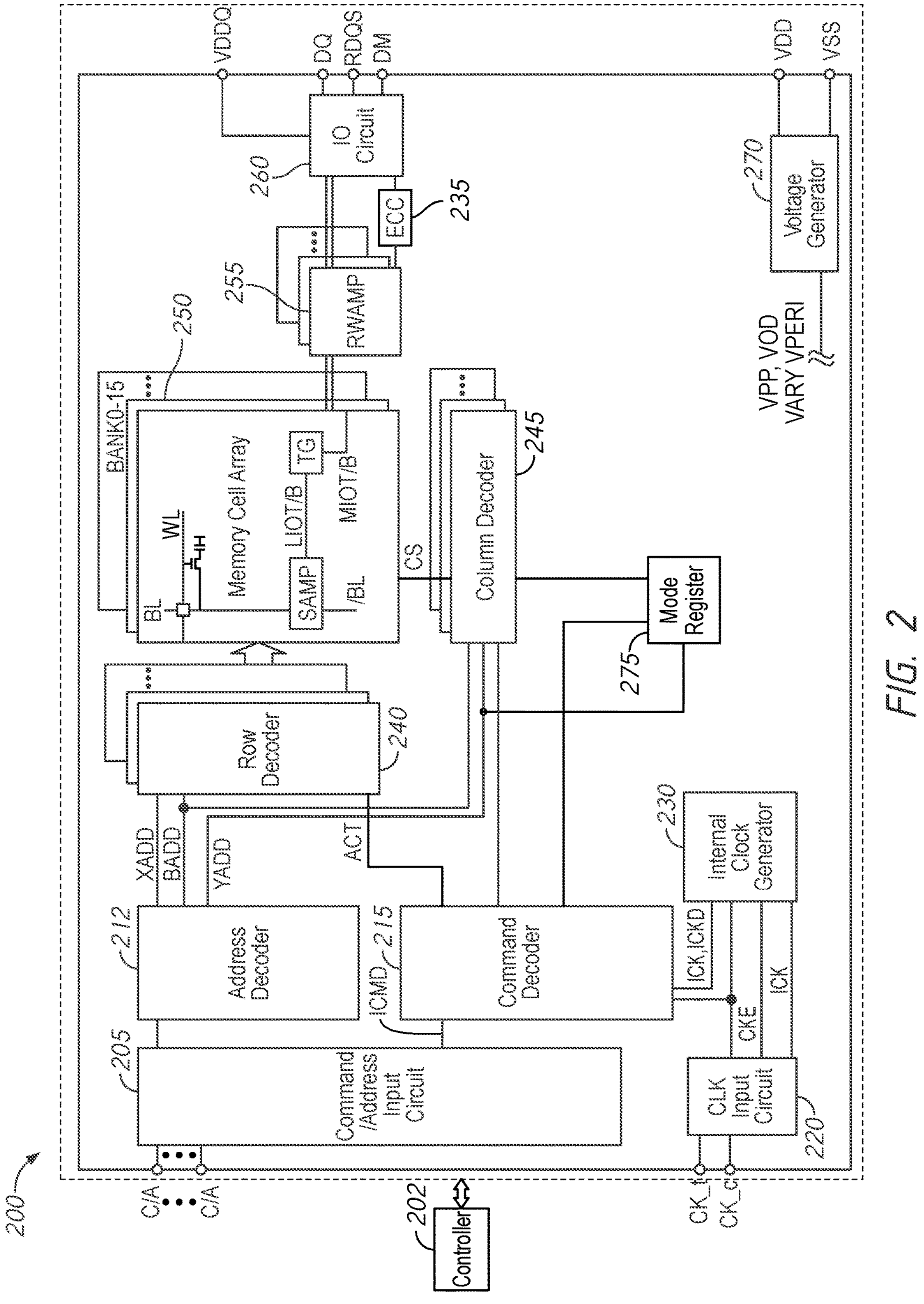
FIG. 2 is a block diagram of a semiconductor device according to some embodiments of the present disclosure.

FIG. 2 is a block diagram of a semiconductor device according to some embodiments of the present disclosure. The apparatus may be a semiconductor device 200, and will be referred as such. In some embodiments, the semiconductor device 200 may include, without limitation, a dynamic random access (DRAM) device integrated into a single semiconductor chip. In some examples, the DRAM may be a double data rate (DDR) memory. In some embodiments, one or all of the memory devices 104(0-7) may include semiconductor device 200.

The semiconductor device 200 includes a memory die. The die may be mounted on an external substrate, for example, a memory module substrate, a mother board or the like (e.g., package-on-package (PoP)). The semiconductor device 200 may further include a memory array 250. The memory array 250 includes a plurality of banks BANK0-15, each bank including a plurality of word lines WL, a plurality of bit lines BL, and a plurality of memory cells MC arranged at intersections of the plurality of word lines WL and the plurality of bit lines BL. Although sixteen banks are shown in FIG. 2, memory array 250 may include any number of banks. The selection of the word line WL is performed by a row decoder 240 and the selection of the bit line BL is performed by a column decoder 245. Sense amplifiers (SAMP) are located for their corresponding bit lines BL and connected to at least one respective local I/O line pair (LIOT/B), which is in turn coupled to at least respective one main I/O line pair (MIOT/B), via transfer gates (TG), which function as switches. The TG may be coupled to one or more read/write amplifiers (RWAMP) 255, which may be coupled to an error correction code (ECC) circuit 235. The ECC circuit 235 may be coupled to an IO circuit 260, which may be coupled to one or more external terminals of semiconductor device 200. Read data from the bit line BL is amplified by the sense amplifier SAMP, and transferred to read/write amplifiers 255 over complementary local data lines (LIOT/B), transfer gate (TG), and complementary main data lines (MIOT/B) to the ECC circuit 235. Conversely, write data outputted from the ECC circuit 235 is transferred to the sense amplifier SAMP over the complementary main data lines MIOT/B, the transfer gate TG, and the complementary local data lines LIOT/B, and written in the memory cell MC coupled to the bit line BL.

The semiconductor device 200 may employ a plurality of external terminals that include command and address terminals coupled to a command/address (C/A) bus to receive command and address signals, clock terminals to receive clock signals CK_t and CK_c, data terminals DQ, RDQS, and power supply terminals VDD, VSS, VDDQ, and VSSQ.

The C/A terminals may be supplied with an address and a bank address signal from outside, for example, from a controller 202. The address signal and the bank address signal supplied to the address terminals are transferred, via a command/address input circuit 205, to an address decoder 212. The address decoder 212 receives the address signals and supplies a decoded row address signal XADD to the row decoder 240, and a decoded column address signal YADD to the column decoder 245. The address decoder 212 also receives the bank address signal BADD and supplies the bank address signal to the row decoder 240 and the column decoder 245.

The C/A terminals may further be supplied with command signals from, for example, a controller 202. In some embodiments, controller 202 may be implemented or included in controller 106. The command signals may be provided as internal command signals ICMD to a command decoder 215 via the command/address input circuit 205. The command decoder 215 includes circuits to decode the internal command signals ICMD to generate various internal signals and commands for performing operations, for example, a row activation signal (ACT) to select a word line and a column select signal (CS) (or referred to simply as column selects) to select one or more bit lines. Another example may be providing internal signals to enable circuits for performing operations, such as control signals to enable signal input buffers that receive clock signals. The internal commands also include output and input activation commands.

In some embodiments, each bank BANK0-15 may be organized into multiple column planes. Each column plane may be associated with multiple column selects (e.g., CS0-63). According to embodiments of the present disclosure, a portion of one or all of the column planes may be used to store metadata. For example, a portion of each column plane associated with a column select (e.g., CS 63) may be used to store metadata. The remaining portions of the column planes (e.g., CS 0-62) may be used to store data associated with the metadata. During a read operation, read data from each column plane associated with the column select may be provided by the memory array 250. Metadata associated with the read data may be provided even though the metadata is associated with a different column select. During a write operation, write data may be written to the memory array 250 in portions of each column plane associated with the column select signal, and metadata associated with the write data may be written to a portion of the column plane.

In some embodiments, the data and the metadata may be accessed by a "two-pass" method. For example, during a read operation, the metadata may be accessed in a first pass by activating the column select associated with the metadata, and the data may be accessed in a second pass by activating the column select associated with the data. In some embodiments, the metadata may be stored the array 250 and/or a buffer outside the array (not shown) while the data is accessed. This may reduce storage needs in embodiments where there is less metadata than data. The metadata and data may be concatenated prior to being output by the semiconductor device 200. For example, the metadata may be appended to the front or the back of the data (e.g., it is output first or last from the semiconductor device 200, respectively).

The C/A terminals may receive an access command which is a read command. When a read command is received, and a bank address, a row address and a column address are timely supplied with the read command, a codeword including read data, metadata, and read ECC data (e.g., parity bits) is read from memory cells in the memory array 250 corresponding to the row address and column address. The read command is received by the command decoder 215, which provides internal commands so that read data from the memory array 250 is provided to the ECC circuit 235. The ECC circuit 235 may use the parity bits in the codeword to determine if the codeword includes any errors, and if any errors are detected, may correct them to generate a corrected codeword (e.g., by changing a state of the identified bit(s) which are in error). The corrected codeword (without the parity bits) is output from the data terminals DQ via the input/output circuit 260.

The C/A terminals may receive an access command which is a write command. When the write command is received, and a bank address, a row address, and a column address are timely supplied as part of the write operation, and write data is supplied through the DQ terminals to the ECC circuit 235. The write data (which may include write data and metadata) supplied to the data terminals DQ is written to a memory cells in the memory array 250 corresponding to the row address and column address. The write command is received by the command decoder 215, which provides internal commands so that the write data is received by data receivers in the input/output circuit 260. The write data is supplied via the input/output circuit 260 to the ECC circuit 235. The ECC circuit 235 may generate ECC data (e.g., a number of parity bits) based on the write data, and the write data and the parity bits may be provided as a codeword to the memory array 250 to be written into the memory cells MC.

The ECC circuit 235 may be used to ensure the fidelity of the data read from a particular group of memory cells to the data written to that group of memory cells. The semiconductor device 200 may include a number of different ECC circuits 235, each of which is responsible for a different portion of the memory cells MC of the memory array 250. For example, there may be one or more ECC circuits 235 for each bank of the memory array 250. Typically, each bank BANK0-15 includes a column plane for the storage of ECC data (e.g., parity bits) and additional column planes for the storage of data (e.g., sixteen column planes). In these applications, the ECC circuit 235 generates eight bits of ECC data (e.g., 8 bits of ECC data) for each cache line of 128 bits. This may allow for the ECC circuit 235 to provide single bit error correction.

According to embodiments of the present disclosure, the ECC circuit 235 may generate additional bits of ECC data (e.g., one additional bit per cache line). In some applications, this may allow the ECC circuit 235 to provide SECDED. In some embodiments, some of the ECC data may be stored in the column plane for ECC data and other ECC data may be stored in portions of the other column planes for storing data. For example, in some embodiments, the ECC data may be stored in portions of the other column planes associated with the same column select associated with metadata. In some embodiments, the ECC data stored with the metadata may be accessed in the same pass as the metadata. In some embodiments, the ECC circuit 235 may generate ECC data based on the data, but in other embodiments, the ECC circuit 235 may generate ECC data based on both the data and the metadata.

The command decoder 215 may access mode register 275 that is programmed with information for setting various modes and features of operation for the semiconductor device 200. For example, the mode register 275 may provide parameters that allow the semiconductor device 200 to operate at different frequencies, provide different burst lengths, allow banks BANK0-15 to be organized into different groups, operate in ×4, ×8, or ×16 mode, and/or other different operating conditions. In some embodiments, mode register 275 may include multiple registers.

The information in the mode register 275 may be programmed by providing the semiconductor device 200 a mode register write command, which causes the semiconductor device 200 to perform a mode register write operation. In some embodiments, data to be written to the mode register 275 is provided via the C/A terminals and/or the DQ terminals. The command decoder 215 accesses the mode register 275, and based on the programmed information along with the internal command signals provides the internal signals to control the circuits of the semiconductor device 200 accordingly. Information programmed in the mode register 275 may be externally provided by the semiconductor device 200 using a mode register read command, which causes the semiconductor device 200 to access the mode register 275 and provide the programmed information (e.g., to the memory controller 202). In some embodiments, the information may be provided via the C/A terminals and/or the DQ terminals.

According to embodiments of the present disclosure, the mode register 275 may be programmed with a value that determines whether or not the semiconductor device 200 provides metadata responsive to a read command based, at least in part, on the column address. In some embodiments, when one value is stored in the mode register, the semiconductor device 200 provides metadata when a portion of the column address is a first value (e.g., one or more bits of the address have certain states), and when another value is stored in the mode register, the semiconductor device 200 provides metadata when the portion of the column address is a second value. For example, when a first value is stored in the mode register, the semiconductor device may provide metadata when CA10 of the column address is '0,' and when a second value is stored in the mode register, the semiconductor device may provide metadata when CA10 of the column address is '1.' In some embodiments, when semiconductor device 200 is one of multiple devices included in a memory module (e.g., memory devices 104(0-7)), semiconductor device 200 may have one value stored in the mode register 275 when another device has another value stored in its mode register and vice versa.

Optionally, the mode register 275 may be programmed with a value that determines whether or not the semiconductor device 200 stores metadata. In some embodiments, this value may be stored in a different register of the mode register than the register that stores the value determining when metadata is provided by the semiconductor device 200. When one value is stored in the register, no metadata may be stored. When another value is stored in the register, metadata may also be stored.

Optionally, the mode register 275 may be programmed with a value that determines whether or not additional ECC data is generated by the ECC circuit 235 and stored in the memory array 250 as described previously. In some embodiments, this value may be stored in a different register than the mode register that stores the value determining when metadata is provided by the semiconductor device 200. When one value is stored in the register, additional ECC data is generated and stored in the memory array 250 in portions of the column plane associated with a same column select as the metadata. In this mode, the semiconductor device 200 may provide SECDED. When another value is stored in the register, no additional ECC data is generated or stored. In this mode, semiconductor device 200 may provide SEC.

According to embodiments of the present disclosure, when semiconductor device 200 is programmed to store metadata and/or ECC data, mode register 275 may generate an address for the metadata and/or ECC data. In some embodiments, the metadata address and/or ECC data address may be based, at least in part, on the column address. In some embodiments, only some of the bits of the column address may be used to generate the metadata and/or ECC address. The metadata address and/or ECC address may be provided from the mode register 275 to the column decoder 245. The address provided by the mode register 275 may allow the metadata and/or ECC data associated with the data indicated by the column address to be read from and/or written to the correct location in the memory array 250.

Turning to the explanation of the external terminals included in the semiconductor device 200, the clock terminals and data clock terminals are supplied with external clock signals and complementary external clock signals. The external clock signals CK_t, CK_c may be supplied to a clock input circuit 220. When enabled, input buffers included in the clock input circuit 220 pass the external clock signals. For example, an input buffer passes the CK_t and CK_c signals when enabled by a CKE signal from the command decoder 215. The clock input circuit 220 may use the external clock signals passed by the enabled input buffers to generate internal clock signal ICK. The internal clock signal ICK are supplied to internal clock circuit 230 for providing one or more clock signals to the various components of semiconductor device 200.

The internal clock circuits 230 includes circuits that provide various phase and frequency controlled internal clock signals based on the received internal clock signals. For example, the internal clock circuits 230 may include a clock path (not shown in FIG. 2) that receives the ICK clock signal and provides internal clock signals ICK and ICKD to the command decoder 215. Optionally, the input/output circuit 260 may include clock circuits and driver circuits for generating and providing the RDQS signal to a controller.

The power supply terminals are supplied with power supply potentials VDD and VSS. These power supply potentials VDD and VSS are supplied to an internal voltage generator circuit 270. The internal voltage generator circuit 270 generates various internal potentials VPP, VOD, VARY, VPERI, and the like and a reference potential ZQVREF based on the power supply potentials VDD and VSS. The internal potential VPP is mainly used in the row decoder 240, the internal potentials VOD and VARY are mainly used in the sense amplifiers included in the memory array 250, and the internal potential VPERI is used in many other circuit blocks.

The power supply terminal is also supplied with power supply potential VDDQ. The power supply potentials VDDQ is supplied to the input/output circuit 260 together with the power supply potential VSS. The power supply potential VDDQ may be the same potential as the power supply potential VDD in an embodiment of the disclosure. The power supply potential VDDQ may be a different potential from the power supply potential VDD in another embodiment of the disclosure. However, the dedicated power supply potential VDDQ is used for the input/output circuit 260 so that power supply noise generated by the input/output circuit 260 does not propagate to the other circuit blocks.

Figure 3:
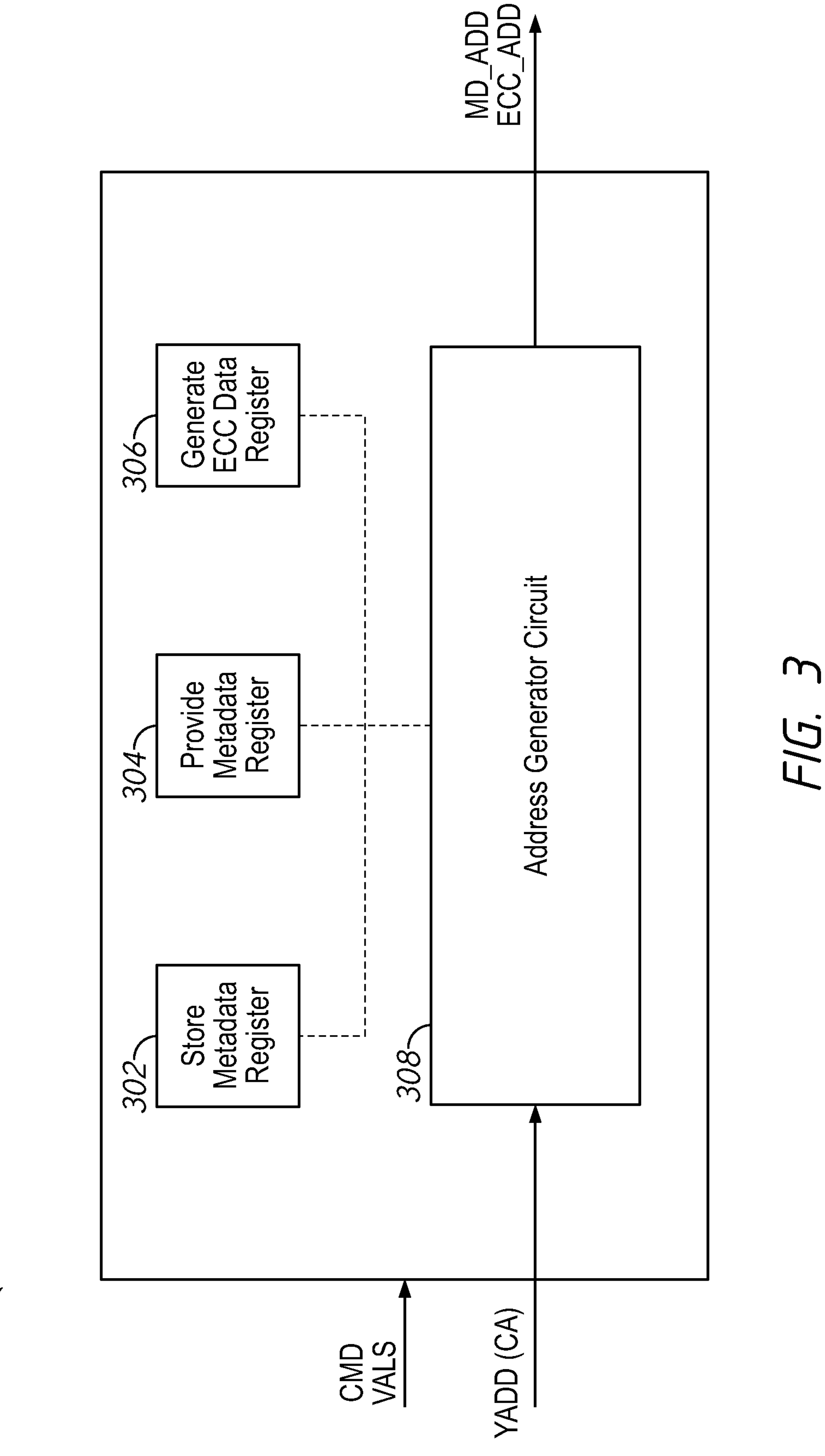
FIG. 3 is a block diagram of a mode register according to an embodiment of the present disclosure.

FIG. 3 is a block diagram of a mode register according to an embodiment of the disclosure. In some embodiments, mode register 300 may be included in mode register 275 shown in FIG. 2. In the example shown in FIG. 3, mode register 300 includes three registers 302, 304, 306. However, mode register 300 may include any number of registers, each of which may store one or more values for various operating parameters of a device, such as semiconductor device 200.

Mode register 300 may receive commands and values. The commands may indicate register read or write commands and which register 302-306 is to be read or written to. The values may indicate, for a mode register write command, the value to be written to the register targeted by the mode register write command. The commands and values may be received from a command decoder, such as command decoder 215.

Register 302 may be programmed with a value that indicates whether or not a device including mode register 300 should store metadata. For example, if a ‘0’ is stored in register 302, the device may not store metadata and if a ‘1’ in register 302 is stored, the device may store metadata. In some embodiments, register 302 may be omitted, and the device may always store metadata.

Register 304 may be programmed with a value that indicates when the device provides metadata. For example, if a ‘0’ is stored in register 304, the device may provide metadata when a portion of the column address (which may be indicated by YADD or CA) is a first state and not provide metadata when a portion of the column address is a second state. For example, the device may provide metadata when CA10 of the column address is ‘0’ and not provide metadata when CA10 is ‘1.’ If a ‘1’ is stored in register 304, the device may provide metadata when the portion of the column address is the second state and not provide metadata when the portion of the column address is the first state. For example, the device may provide metadata when CA10 of the column address is ‘1’ and not provide metadata when CA10 is ‘0.’ In some embodiments, register 304 may be disabled or omitted if the semiconductor device is operating in ×8 mode.

Register 306 may be programmed with a value that indicates whether or not a device including mode register 300 should store ECC data with a same column select as the metadata (additional ECC data may be stored in the ECC column plane). For example, if a ‘0’ is stored in register 306, the device may not store the ECC data with the metadata and if a ‘1’ in register 306 is stored, the device may store ECC data with the metadata. In some embodiments, register 306 may be omitted, and the device may always store ECC data with the metadata or may not store ECC data with the metadata, depending on the embodiment.

Mode register 300 may receive a column address YADD (or CA). The column address may be provided by an address decoder, such as address decoder 212. The column address may be provided to an address generator circuit 308. The address generator circuit 308 may generate the metadata address (MD_ADD) and/or the ECC address (ECC_ADD) associated with the appropriate metadata and/or ECC data based, at least in part, on the column address. The addresses may be provided to a column decoder, such as column decoder 245. In some embodiments, the column address is multiple bits (e.g., 12 bits), and the metadata and/or ECC address is based on less than all of the bits of the column address (e.g., 6 bits, 7 bits). In some embodiments, the address generator circuit 308 may include one or more logic circuits (not shown) that generate the address(s) based on a mapping of data stored in the memory array to the metadata and/or ECC data stored in the memory array.

Optionally, in some embodiments, the address generator circuit 308 may be enabled or disabled based on values stored in registers 302, 304, and 306. For example, the address generator circuit 308 may be disabled if the value in register 302 indicates no metadata is stored. In another example, the address generator 308 may only generate metadata addresses if the value in register 306 indicates no ECC data is stored with the same column select as the metadata. In a further example, the address generator circuit 308 may flip one or more bits of the column address when generating the addresses based on the value stored in register 304. In some examples, this may ensure the device responds consistently regardless of which mode is indicated by the value stored in register 304.

Figure 4:
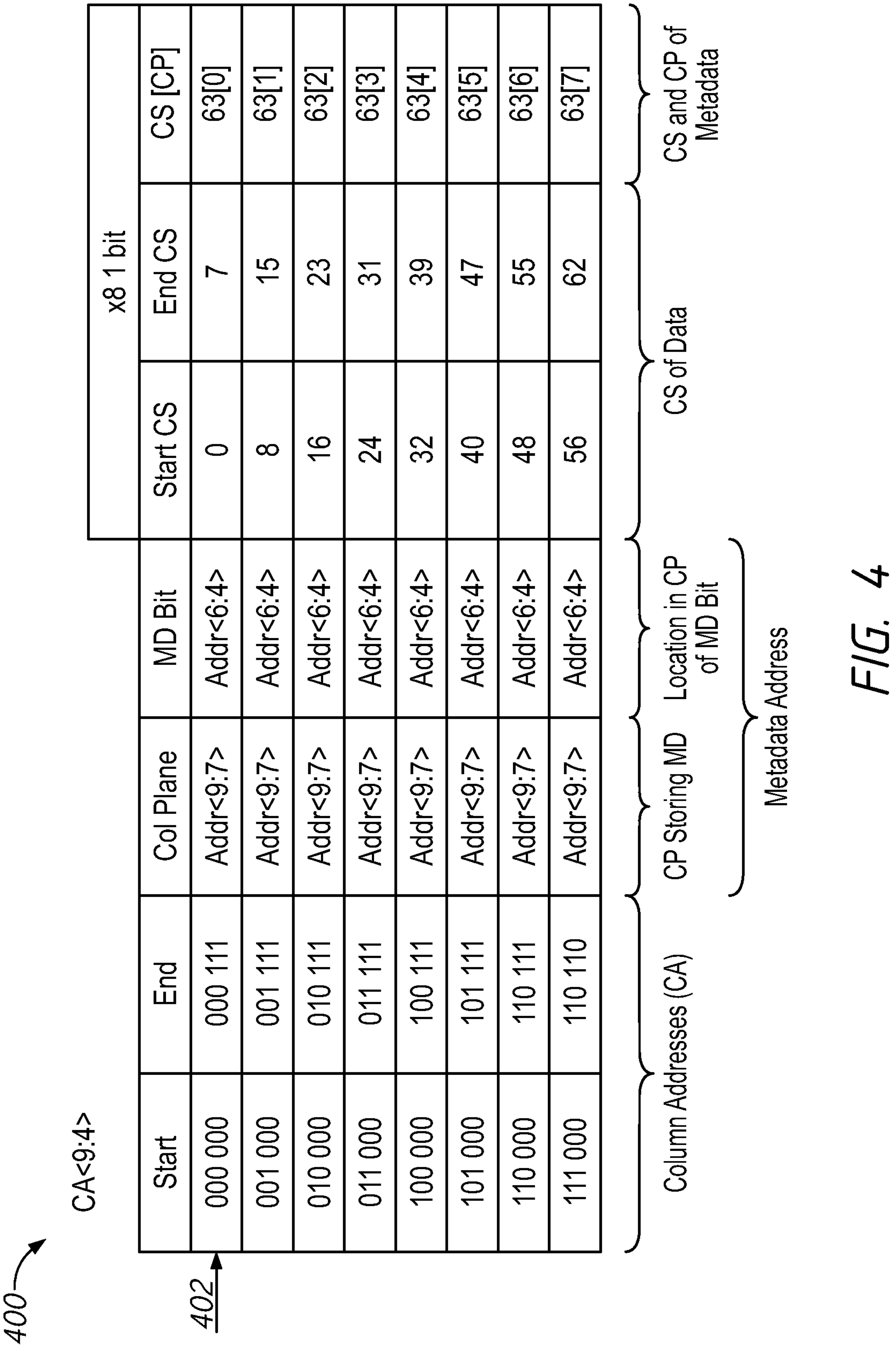
FIG. 4 is an example of a mapping of metadata to data according to an embodiment of the present disclosure.

FIG. 4 is an example of a mapping of metadata to data according to an embodiment of the present disclosure. In some embodiments, the mapping 400 may be implemented by a mode register, such as mode register 300. The mapping 400 may be implemented when a device, such as memory device 104 and/or semiconductor device 200 is operating in a ×8 mode. The mapping 400 maps one bit of metadata to one cache line of data.

The full column address (e.g., CA<11:0>) indicates the location of the data to be accessed (e.g., where data is to be read from or written to in the memory array). The metadata address may be generated based on the column address. In some embodiments, not all of the bits of the column address are used to generate the metadata address. In the example mapping for a ×8 mode, CA<9:4> are used to generate the metadata address. The first two columns of mapping 400 provide ranges of the column addresses for CA<9:4>. The ranges are labelled "Start" and "End." For example, the first row indicated by arrow 402 provides the mapping for column addresses having CA<9:4> from 000000 to 000111.

The next two columns of mapping 400 indicate the metadata address. The metadata address includes CA<9:4> of the column address. That is, the metadata address is six bits and corresponds to the ninth through fourth bits of the column address. CA<9:7> provides the address for which column plane includes the metadata associated with the data. While there are sixteen column planes, only sixty-three bits of metadata are stored when one bit of metadata is associated with the data of each of the remaining column selects. While a column select is associated with 128 bits, only 63 bits of that space is used (just under half). Thus, in some embodiments, the metadata may be stored in half of the column planes (e.g., eight of the sixteen). Accordingly, three rather than four bits may be used to indicate the column plane of the metadata. CA<6:4> provide the location within the column plane of the bit of metadata associated with the data. As explained previously, each column plane provides eight bits responsive to a column select signal. Thus, three bits are used to indicate which of the eight bits of metadata is associated with the data at the column address.

Under the ×8 1 bit heading of the mapping 400, the "Start CS" and "End CS" indicate the range of column selects for the data associated the column addresses in the first two columns. For example, in the row indicated by arrow 402, column selects 0-7 are associated with CA<9:4> from 000000 to 000111. These column selects are associated with the data stored in the memory array. The final column indicates the column select and column plane for the metadata associated with the data for column selects in the given range. In the row indicated by arrow 402, the metadata stored in column plane (CP) 0 accessed by CS 63 is associated with the data of CS 0-7.

FIG. 5 is an example of a mapping of metadata to data according to an embodiment of the present disclosure. In some embodiments, the mapping 500 may be implemented by a mode register, such as mode register 300. The mapping 500 may be implemented when a device, such as memory device 104 and/or semiconductor device 200 is operating in a ×4 mode. The mapping 500 maps one bit of metadata to one cache line of data.

Similar to the mapping 400 shown in FIG. 4, not all of the bits of the column address are used to generate the metadata address for mapping 500. In the example mapping for a ×4 mode, CA<10:4> are used to generate the metadata address. When operating in ×4 mode, not all of the memory devices may provide a bit of metadata, depending on the column address (e.g., when CA10=1 or when CA10=0). Accordingly, in some embodiments, an extra bit may be used (e.g., CA10) to store the metadata in a manner that facilitates proper receiving and providing of metadata. Similar to mapping 400, the first two columns of mapping 500 provide ranges of the column addresses for CA<10:4>. The ranges are labelled "Start" and "End." For example, the first row indicated by arrow 502 provides the mapping for column addresses having CA<10:4> from 0000000 to 0000111.

The next two columns of mapping 500 indicate the metadata address. The metadata address includes CA<10:4> of the column address. That is, the metadata address is seven bits and corresponds to the tenth through fourth bits of the column address. The fourth most significant bits provide the address for which column plane includes the metadata associated with the data. However, the column address bits are provided "out of order" to generate the metadata address. Thus, instead of CA<10:7> indicating the column plane of the metadata, CA<9, 8, 10, 7> indicates the plane of the metadata. By using four bits, for the column plane, metadata may be stored in any of the sixteen column planes. This may allow the memory to respond properly based on a mode of the memory device as to when it provides or does not provide metadata. In some embodiments, although all sixteen column planes are addressable, the metadata may only be located in half of the column planes. Similar to mapping 400, in mapping 500, CA<6:4> provides the location within the column plane of the bit of metadata associated with the data. As explained previously, each column plane provides eight bits responsive to a column select signal. Thus, three bits are used to indicate which of the eight bits of metadata is associated with the data at the column address.

Under the ×4 1 bit heading of the mapping 500, the "Start CS" and "End CS" indicate the range of column selects for the data associated the column addresses in the first two columns. For example, in the row indicated by arrow 502, column selects 0-7 are associated with CA<10:4> from 0000000 to 0000111. These column selects are associated with the data stored in the memory array. The final column indicates the column select and column plane for the metadata associated with the data for column selects in the given range. In the row indicated by arrow 502, the metadata stored in column plane (CP) 0 accessed by CS 63 is associated with the data of CS 0-7.

The mappings 400 and 500 are provided merely as examples, and other mappings may be used without exceeding the scope of the present disclosure.

As noted, when only one bit of metadata is associated with each prefetch, not all of the available bits associated with the column select may be used. Optionally, in some embodiments, the "extra" space may be used to store ECC data. In some embodiments, a similar addressing scheme to the metadata may be used to address the ECC data to map it to the data. In some embodiments, a same addressing scheme may be used (e.g., addresses with CA10=1 may be associated with metadata and addresses with CA10=0 may be associated with ECC data). In some embodiments, the ECC data may be access at a same time as the metadata. In some embodiments, the ECC data may be accessed before or after the metadata. In some embodiments, the ECC data may be concatenated or otherwise combined with the additional ECC data stored in a column plane for storing ECC data. The ECC data and the additional ECC data may be combined prior to being provided to an ECC circuit (such as ECC circuit 235) or may be combined by the ECC circuit.

Figure 6:
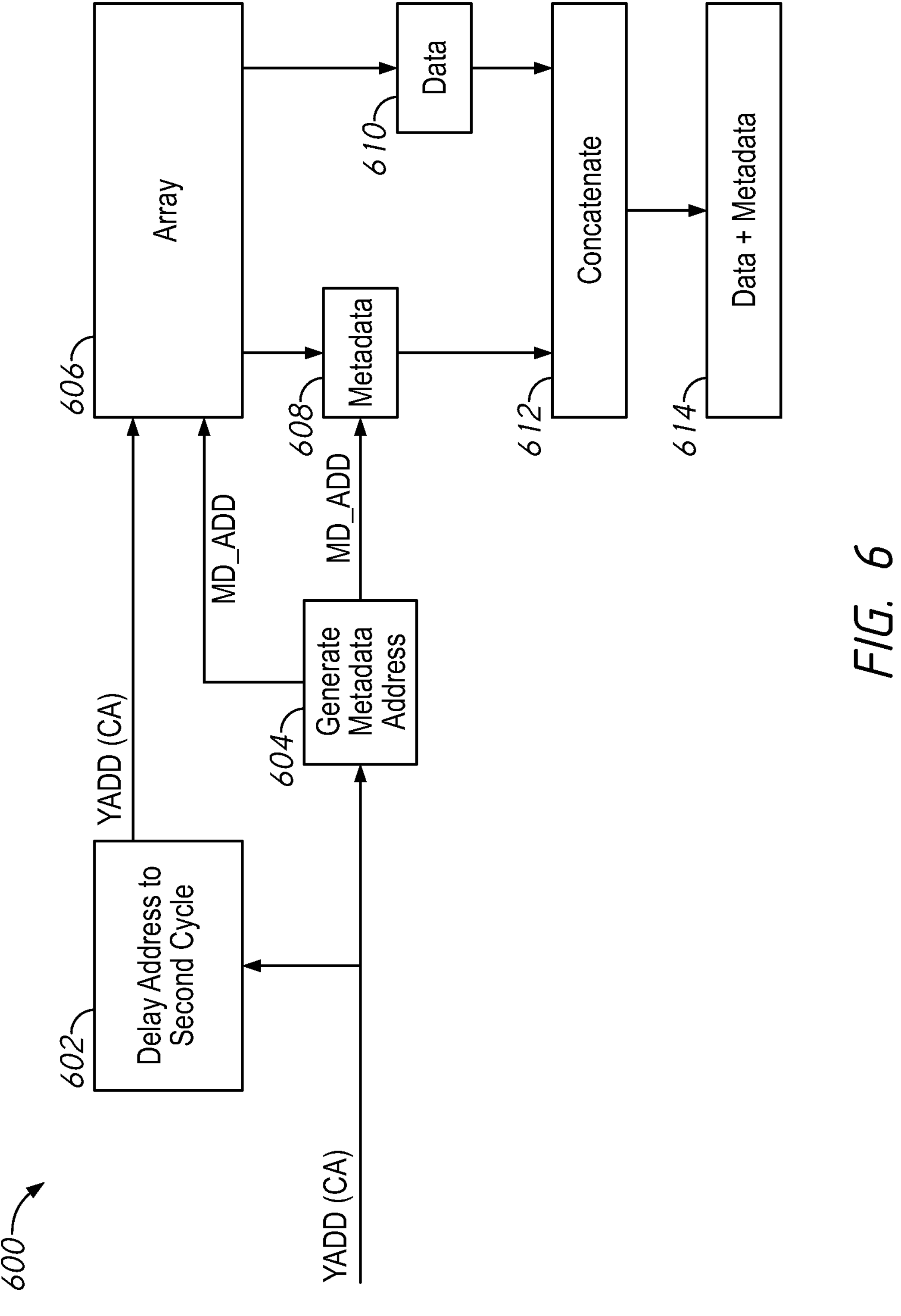
FIG. 6 is a flow diagram illustrating a two-pass memory access operation according to an embodiment of the present disclosure.

FIG. 6 is a flow diagram illustrating a two-pass memory access operation according to an embodiment of the present disclosure. In some embodiments, the access operation shown in flow diagram 600 may be performed by memory device 104 and/or semiconductor device 200.

When a column address YADD (or CA) indicating a location of data to be accessed in a memory array, it may be delayed prior to being provided to a column decoder (e.g., a delay circuit, a buffer, etc.) as indicated by block 602. The column address may be used (e.g., by a mode register) to generate a metadata address (e.g., based on mappings such as mapping 400 and/or 500) as indicated by block 604. All or a portion of metadata address MD_ADD may be provided to a column decoder to cause the array indicated by block 606 to provide metadata indicated by 608. Activating the column select for the metadata (e.g., CS 63), may cause more than one bit of metadata to be provided from the array 606. The metadata address MD_ADD may further be used to select which of the bit or bits of the metadata provided from the array corresponds to the data. The "extra" metadata provided by the memory array may be ignored or discarded. The selected metadata may be held in the array, register, buffer, or other storage area. After the metadata has been accessed, the delayed column address is provided to the column decoder to cause the array to provide the data as indicated by block 610. The data and metadata may be concatenated as indicated by block 612. The combined data and metadata indicated by block 614 may then be provided (e.g., via an IO circuit to DQ pins).

Figure 7:
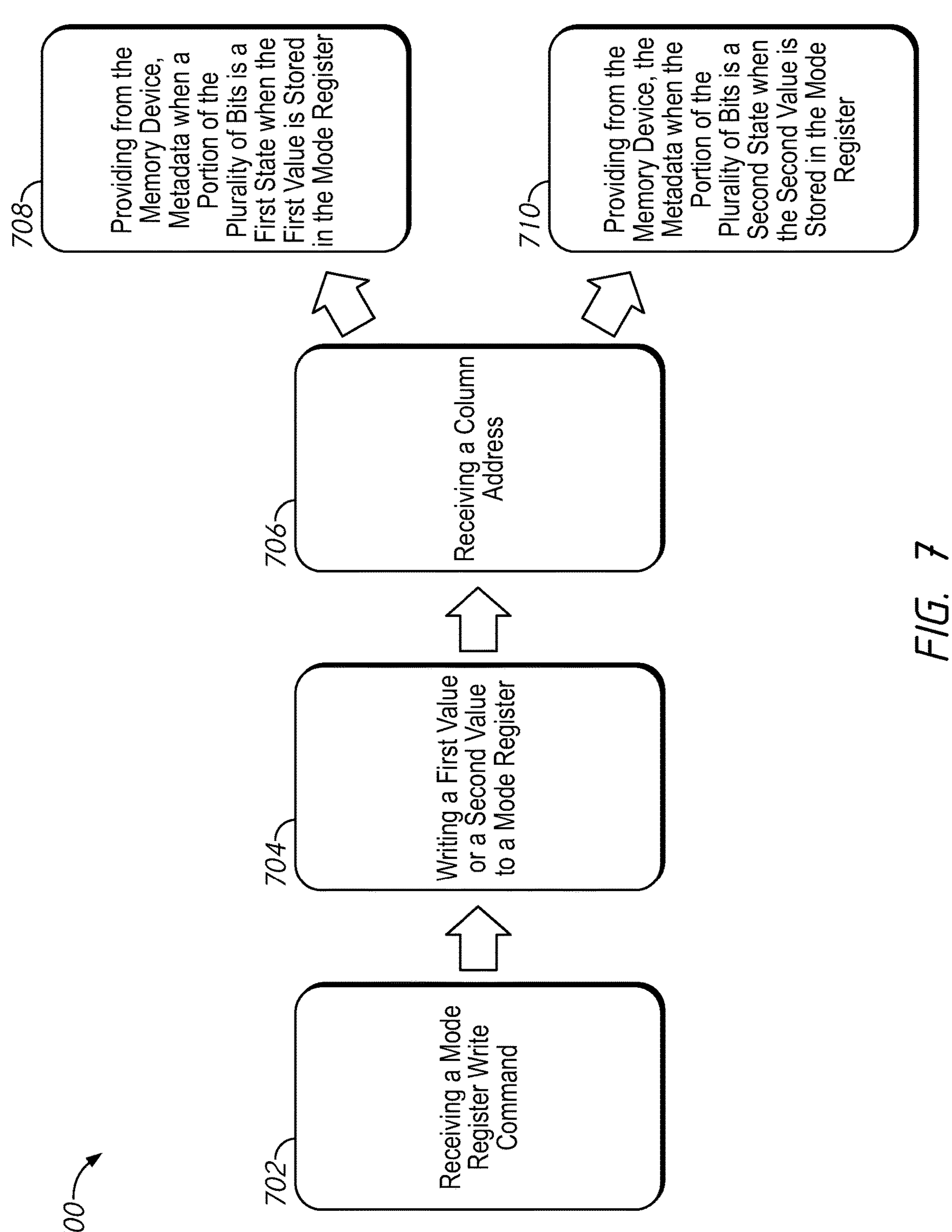
FIG. 7 is a flow chart of a method according to an embodiment of the present disclosure.

FIG. 7 is a flow chart of a method according to an embodiment of the present disclosure. In some embodiments, the method 700 may be performed, at least in part, by a device (e.g., memory device 104, semiconductor device 200) and/or a computing system, such as computing system 100.

At block 702, "receiving a mode register write command" may be performed. In some embodiments, the command may be received from a controller, such as controller 106 and/or controller 202. At block 704, "writing a first value or a second value to a mode register" may be performed. In some embodiments, block 704 may be performed responsive to the mode register write command. In some embodiments, the mode register may include mode register 275 and/or 300.

At block 706, "receiving a column address" may be performed. In some embodiments, the column address may include a plurality of bits Responsive, at least in part, to the column address, at block 708 "providing from the memory device, metadata when a portion of the plurality of bits is a first state when the first value is stored in the mode register" may be performed and at block 710 "providing from the memory device, the metadata when the portion of the plurality of bits is a second state when the second value is stored in the mode register" may be performed.

In some embodiments, method 700 may further include receiving a read command associated with the column address, and providing the metadata is further responsive to the read command. In some embodiments, method 700 may further include providing data responsive to the read command. In some embodiments, the metadata is appended to the data by the memory device In some embodiments, such as when an apparatus or system includes more than one memory device (e.g., memory devices 104(0-7)), method 700 may further include receiving a second mode register write command at a second memory device, responsive to the second mode register write command, writing the first value or the second value to a second mode register of the second memory device, receiving the column address at the second memory device, responsive, at least in part, to the column address, providing from the second memory device, second metadata when the portion of the plurality of bits is the first state when the first value is stored in the second mode register, and providing from the memory device, the second metadata when the portion of the plurality of bits is the second state when the second value is stored in the second mode register.

In some embodiments including multiple memory devices, the first value may be written to the second mode register when the second value is written to the mode register and the second value is written to the second mode register when the first value is written to the mode register. In some embodiments, this may cause the memory devices to provide metadata at different times from one another and/or provide metadata for different column addresses from one another.

Figure 8:
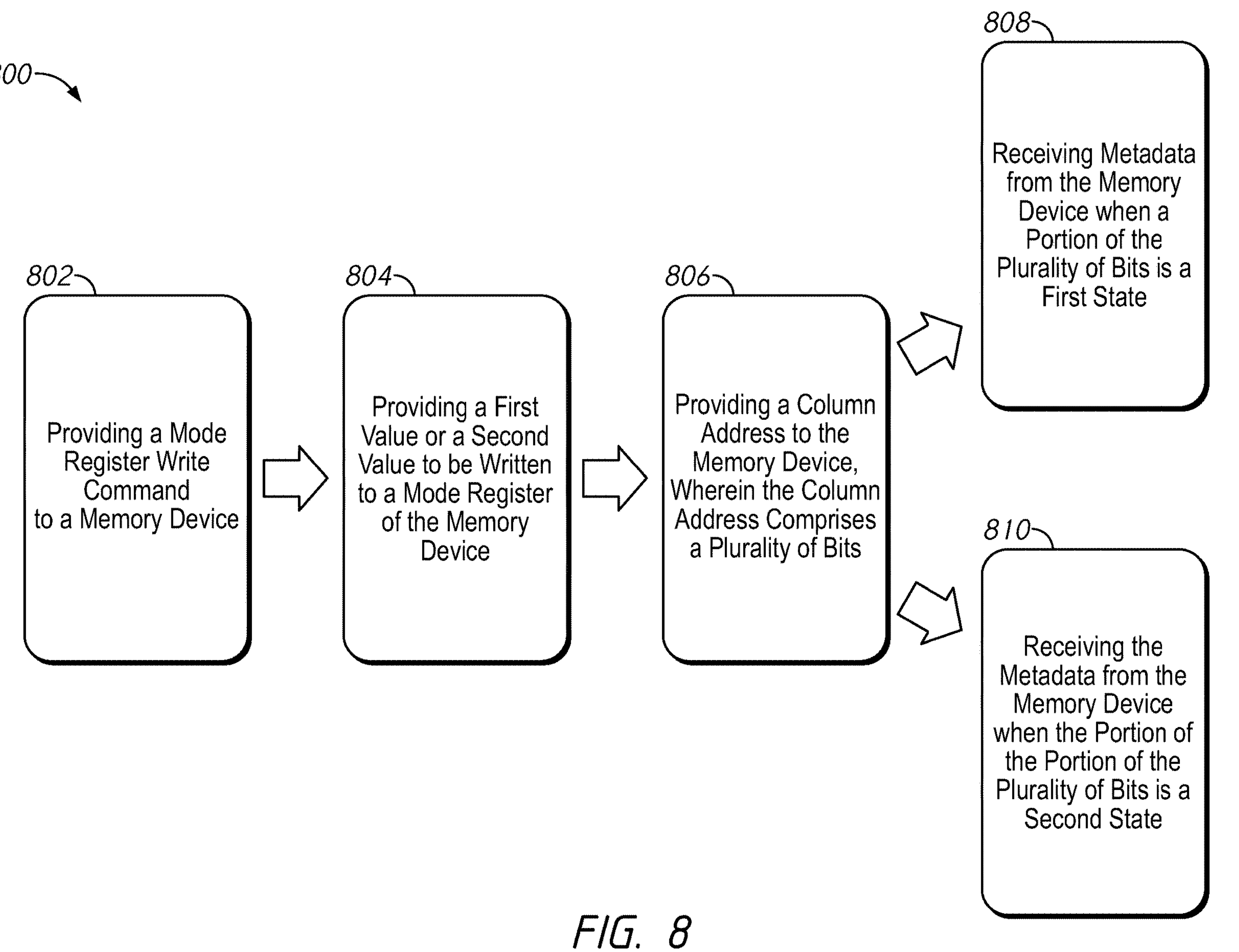
FIG. 8 is a flow chart of a method according to an embodiment of the present disclosure.

FIG. 8 is a flow chart of a method according to an embodiment of the present disclosure. In some embodiments, the method 800 may be performed, at least in part, by a controller, such as controller 106 and/or controller 202.

At block 802, "providing a mode register write command to a memory device" may be performed. In some embodiments, the memory device may include one or all of memory devices 104(0-7) and/or semiconductor device 200.

At block 804 "providing a first value or a second value to be written to a mode register of the memory device" may be performed. In some embodiments, the first or second value may include a bit. In some embodiments, the first value may be '0' and the second value may be '1.'

At block 806, "providing a column address to the memory device, wherein the column address comprises a plurality of bits" may be performed. In some examples, the column address may include twelve bits.

At block 808, "receiving metadata from the memory device when a portion of the plurality of bits is a first state" may be performed when the first value is written to the mode register and at block 810 "receiving the metadata from the memory device when the portion of the plurality of bits is a second state" may be performed when the second value is written to the mode register.

In some embodiments, method 800 may further include providing a read command to the memory device and receiving data from the memory device associated with the column address, wherein the data is associated with the metadata. In some embodiments, the controller receives the data from four DQ pins of the memory device.

In some embodiments, when the controller communicates with multiple memory devices, method 800 may include providing a second mode register write command to a second memory device from the controller, providing the first value or the second value to be written to a second mode register of the second memory device from the controller, providing the column address to the second memory device, receiving second metadata from the memory device when the portion of the plurality of bits is the first state when the first value is written to the second mode register, and receiving the second metadata from the memory device when the portion of the plurality of bits is the second state when the second value is written to the second mode register. In some of these embodiments, the controller may program different values into different ones of the memory devices. This may cause the memory devices to provide metadata at different times from one another and/or provide metadata for different column addresses from one another.

Figure 9:
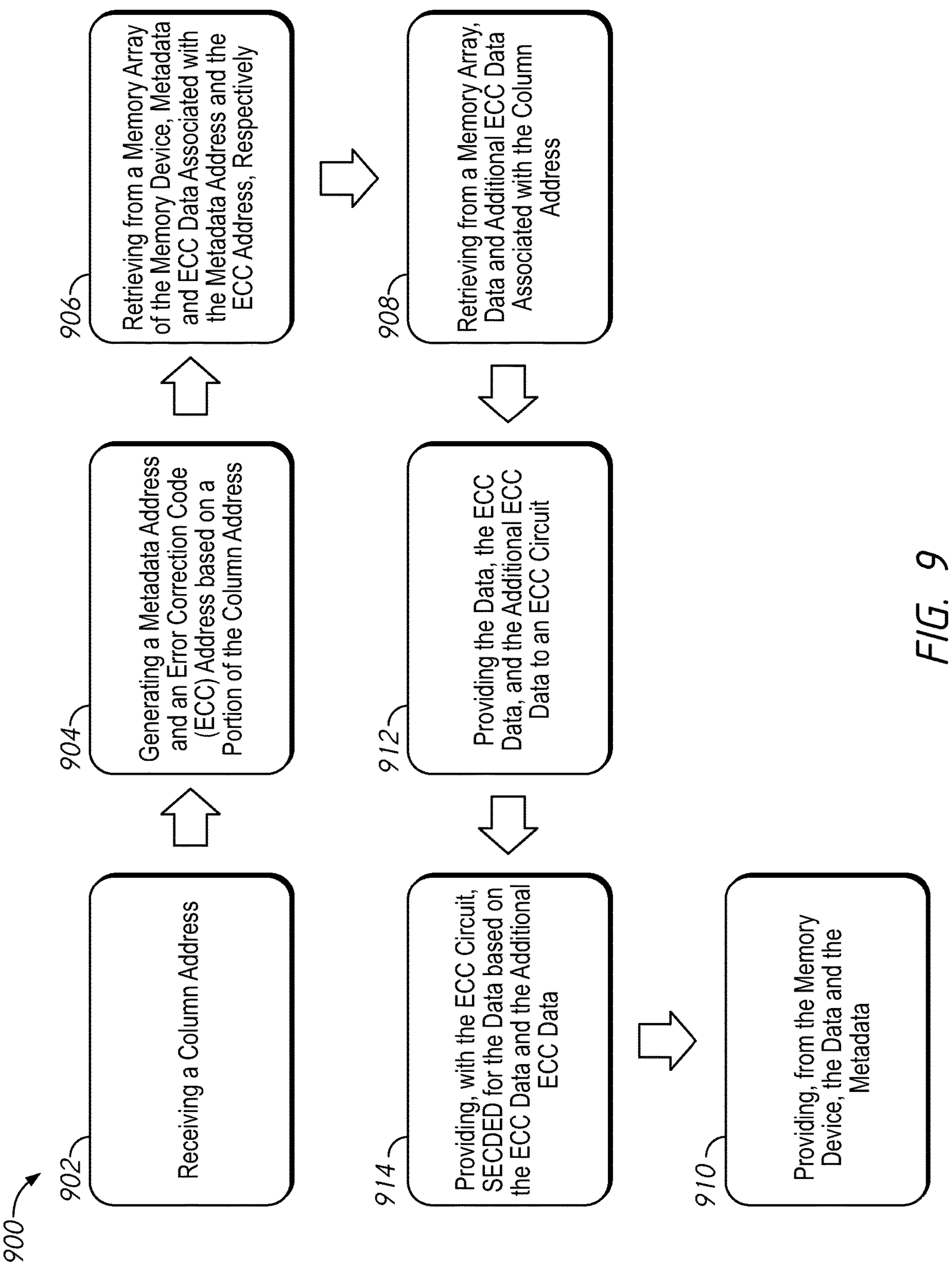
FIG. 9 is a flow chart of a method according to an embodiment of the present disclosure.

FIG. 9 is a flow chart of a method according to an embodiment of the present disclosure. In some embodiments, the method 900 may be performed, at least in part, by a memory device such as memory device 104 and/or semiconductor device 200. In some embodiments, the method 900 may be performed at least in part by a mode register, such as mode register 275 and/or 300. In some embodiments, the method 900 may be performed, at least in part, by an ECC circuit, such as ECC circuit 235.

At block 902, "receiving a column address" may be performed. At block 904, "generating a metadata address and an error correction code (ECC) address based on a portion of the column address" may be performed. In some embodiments, the portion may be less than an entirety of the column address. In some embodiments, the address may be generated by a mode register. In some embodiments, the addressing may be based, at least in part, on a mapping, such as mapping 400 and/or 500.

At block 906, "retrieving from a memory array of the memory device, metadata and ECC data associated with the metadata address and the ECC address, respectively" may be performed. In some embodiments, the ECC data may include one bit.

At block 908, "retrieving from the memory array, data and additional ECC data associated with the column address" may be performed. In some embodiments, the additional ECC data may be stored in a column plane of the memory array for storing ECC data. In some embodiments, the data and the additional ECC data are retrieved after the metadata and the ECC data.

At block 910, "providing, from the memory device, the data and the metadata" may be performed.

In some embodiments, the ECC data and additional ECC data are used by the ECC circuit for correcting the data and remains internal to the memory device. In these embodiments, at block 912, "providing the data, the ECC data, and the additional ECC data to an ECC circuit" may be performed. In some embodiments, method 900 may further include concatenating the ECC data and the additional ECC data. At block 914, "providing, with the ECC circuit, single error detection and double error detection (SECDED) for the data based on the ECC data and the additional ECC data" may be performed. In some embodiments, metadata may also be provided to the ECC circuit, and the ECC circuit may provide SECDED for the data and the metadata.

Figure 10:
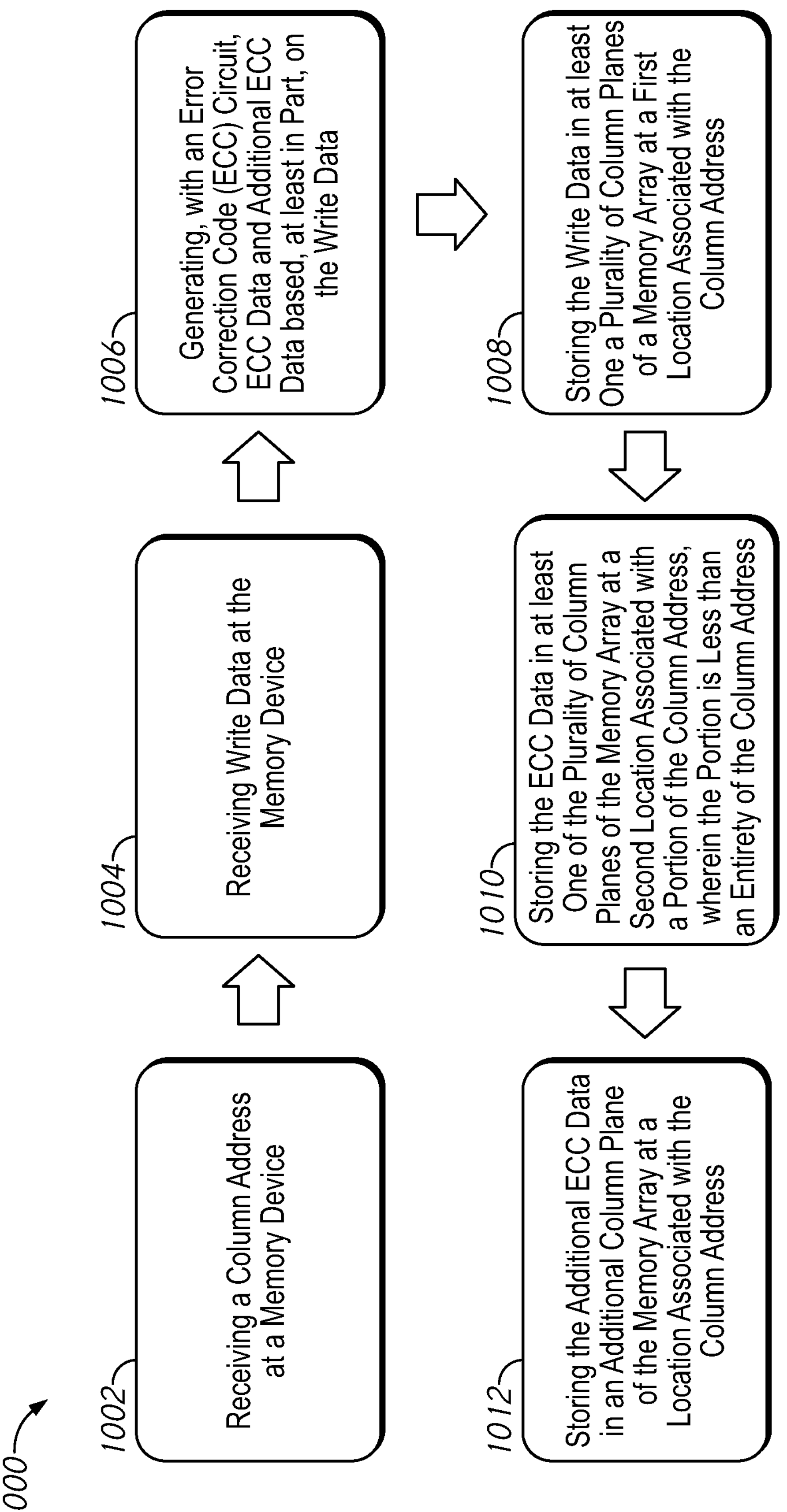
FIG. 10 is a flow chart of a method according to an embodiment of the present disclosure.

FIG. 10 is a flow chart of a method according to an embodiment of the present disclosure. In some embodiments, the method 1000 may be performed, at least in part, by a memory device such as memory device 104 and/or semiconductor device 200. In some embodiments, the method 900 may be performed at least in part by a mode register, such as mode register 275 and/or 300. In some embodiments, the method 900 may be performed, at least in part, by an ECC circuit, such as ECC circuit 235.

At block 1002, "receiving a column address at a memory device" may be performed. At block 1004, "receiving write data at the memory device" may be performed. At block 1006, "generating, with an error correction code (ECC) circuit, ECC data and additional ECC data based, at least in part, on the write data" may be performed.

At block 1008, "storing the write data in at least one a plurality of column planes of a memory array at a first location associated with the column address" may be performed.

At block 1010, "storing the ECC data in at least one of the plurality of column planes of the memory array at a second location associated with a portion of the column address, wherein the portion is less than an entirety of the column address" may be performed. In some embodiments, the location may be based on an ECC address generated based on the column address. In some embodiments, the ECC address may be generated by a mode register based on a mapping, such as described with reference to FIGS. 4 and 5.

At block 1012, "storing the additional ECC data in an additional column plane of the memory array at a location associated with the column address" may be performed.

Optionally, method 1000 may further include receiving metadata and storing the metadata in the at least one of the plurality of column planes of the memory array at a third location associated with the portion of the column address. In some embodiments, the metadata and the ECC data are associated with a same column select signal of a plurality of column select signals. In some embodiments, the data is associated with a different one of the plurality of column select signals. In some embodiments, the ECC data and the additional ECC data provide single error detection and double error detection (SECDED) for the data or for both the data and the metadata.

Examples of the Present Disclosure

In some examples, an apparatus may comprise an address decoder configured to receive a column address comprising a plurality of bits; and a memory array comprising a plurality of column planes, wherein a portion of individual ones of the plurality of column planes are configured to store metadata, wherein the metadata is associated with data associated with other portions of the plurality of column planes, wherein the metadata is mapped to the data by a metadata address based on a portion of the column address, wherein the portion comprises less than all of the plurality of bits.

In some examples of the apparatus, the metadata is stored in half of the plurality of column planes In some examples of the apparatus, a seventh, an eighth, and a ninth bit of the column address indicate a column plane of the plurality of column planes including the metadata mapped to the data of another portion of the plurality of column planes, and a fourth, fifth, and sixth bit of the column address indicate a location of the metadata in the column plane mapped to the data of another portion of the plurality of column planes. In some examples of the apparatus, the metadata associated with the data of a first eight consecutive column selects of a plurality of column selects is stored in a first column plane of the plurality of column planes and the metadata associated with a second eight consecutive column selects of the plurality of column selects is stored in a second column plane of the plurality of column planes, the metadata associated with the data of a third eight consecutive column selects of the plurality of column selects is stored in a third column plane of the plurality of column planes.

In some examples of the apparatus, a seventh, an eighth, a ninth, and a tenth bit of the column address indicates a column plane of the plurality of column planes including the metadata mapped to the data of another portion of the plurality of column planes, and a fourth, fifth, and sixth bit indicate a location of the metadata in the column plane mapped to the data of another portion of the plurality of column planes. In some examples, the metadata is stored in locations of the portion of the individual ones of the plurality of column planes associated with an address where the tenth bit is a first value. In some examples, an address of the column plane associated with the metadata comprises the ninth bit as a most significant bit, the eighth bit as a second most significant bit, the tenth bit as a third most significant bit, and the seventh bit as a least significant bit. In some examples, the metadata associated with the data of a first eight consecutive column selects of a plurality of column selects is stored in a first column plane of the plurality of column planes, the metadata associated with a second eight consecutive column selects of the plurality of column selects is stored in a second column plane of the plurality of column planes, the metadata associated with the data of a third eight consecutive column selects of the plurality of column selects is stored in a fifth column plane of the plurality of column planes, the metadata associated with the data of a fourth eight consecutive column selects of the plurality of column selects is stored in a sixth column plane of the plurality of column planes, the metadata associated with the data of a fifth eight consecutive column selects of the plurality of column selects is stored in a ninth column plane of the plurality of column planes, the metadata associated with the data of a sixth eight consecutive column selects of the plurality of column selects is stored in a tenth column plane of the plurality of column planes, the metadata associated with the data of a seventh eight consecutive column selects of the plurality of column selects is stored in a thirteenth column plane of the plurality of column planes, and the metadata associated with the data of a final seven consecutive column selects of the plurality of column selects is stored in a fourteenth column plane of the plurality of column planes.

In some examples of the apparatus, the portion of the plurality of column planes storing the metadata is associated with a first column select of a plurality of column selects and the data is associated with other ones of the plurality of column selects.

In some examples of the apparatus, individual planes of the plurality of column planes is associated with sixty-four column selects, wherein one column select is associated with the metadata and a remaining sixty-three column selects are associated with the data. In some examples, the memory comprises a plurality of banks, wherein each bank comprises sixteen column planes storing the data, wherein eight of the sixteen column planes store the metadata.

In some examples, the apparatus further comprises a mode register configured to receive the column address and generate the metadata address.

In some examples, a method may comprise receiving a column address at a memory device; generating a metadata address based on a portion of the column address, wherein the portion is less than an entirety of the column address; retrieving from a memory array of the memory device, metadata associated with the metadata address; retrieving from the memory array, data associated with the column address; and providing, from the memory device, the data and the metadata.

In some examples of the method, the data is retrieved after the metadata.

In some examples, the method further includes concatenating the metadata and the data. In some examples, the metadata is concatenated to an end of the data.

In some examples of the method, the metadata address is generated by a mode register of the memory device.

In some examples of the method, generating the metadata address comprises selecting fourth through ninth bits of the column address as the metadata address.

In some examples of the method, generating the metadata address comprises selecting a fourth through tenth bits of the column address as the metadata address.

In some examples of the method, the data is retrieved from a plurality of portions of corresponding ones of a plurality of column planes associated with a first one of a plurality of column selects. In some examples, the metadata is retrieved from a portion of one of the plurality of column planes, different from the plurality of portions, associated with a second one of the plurality of column selects.

In some examples of the method, the metadata comprises one bit.

In some examples, a system may comprise a plurality of memory devices, wherein each memory device comprises: a memory array comprising a plurality of column planes, wherein a portion of individual ones of the plurality of column planes are configured to store metadata, wherein the metadata is associated with data associated with other portions of the plurality of column planes, wherein the metadata is mapped to the data by a metadata address based on a portion of a column address comprising a plurality of bits, wherein the portion comprises less than all of the plurality of bits.

In some examples of the system, each of the plurality of memory devices is configured to provide one bit of metadata.

In some examples of the system, half of the plurality of memory devices are configured to provide one bit of metadata based, at least in part, on the column address.

In some examples of the system, the plurality of memory devices comprises eight memory devices.

In some examples, the system further comprises a controller coupled to the plurality of memory devices, wherein the controller is configured to ignore the data, the metadata, or a combination thereof, from one or more of the plurality of memory devices based, at least in part, on the column address.

In some examples of the system, the portion of the column address associated with the metadata address comprises six or seven bits.

In some examples of the system, a seventh, an eighth, and a ninth bit of the column address indicate a column plane of the plurality of column planes including the metadata mapped to the data of another portion of the plurality of column planes, and a fourth, fifth, and sixth bit of the column address indicate a location of the metadata in the column plane mapped to the data of another portion of the plurality of column planes.

In some examples of the system, half of the plurality of column planes store the metadata. In some examples, a seventh, an eighth, a ninth, and a tenth bit of the column address indicates a column plane of the plurality of column planes including the metadata mapped to the data of another portion of the plurality of column planes, and a fourth, fifth, and sixth bit indicate a location of the metadata in the column plane mapped to the data of another portion of the plurality of column planes. In some examples, the metadata is stored in locations of the portion of the individual ones of the plurality of planes associated with an address where the tenth bit is a first value. In some examples, an address of the column plane associated with the metadata comprises the ninth bit as a most significant bit, the eighth bit as a second most significant bit, the tenth bit as a third most significant bit, and the seventh bit as a least significant bit.

In some examples, a method may include providing a column address to a plurality of memory devices from a controller; providing a read command to the plurality of memory devices from the controller; and receiving from the plurality of memory devices, data associated with the column address and metadata associated with the data.

In some examples of the method, a bit of metadata is received from each of the plurality of memory devices. In some examples, ignoring bits of metadata received from one or more of the plurality of memory devices at the controller based, at least in part on the column address. In some examples, which metadata of the plurality of memory devices is ignored is based on a tenth bit of the column address.

In some examples of the method, metadata is received from each of at least one but less than all of the plurality of memory devices. In some examples, which of the plurality of memory devices that metadata to the controller is based, at least in part, on the column address. In some examples, which of the plurality of memory devices that metadata to the controller is based on a tenth bit of the column address.

The apparatuses, systems, and methods disclosed herein may allow for efficient storage of metadata and/or resolve issues when less than one bit of metadata is desired per memory device. The addressing of the metadata disclosed herein may minimize impacts on the time between an internal read and when the data is provided from the array (tAA). The apparatuses, systems, and methods disclosed herein may allow for additional ECC data to be stored, which may permit SECDED.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:

an address decoder configured to receive a column address comprising a plurality of bits; and a memory array comprising a plurality of column planes, wherein a portion of individual ones of the plurality of column planes are configured to store metadata and additional error correction (ECC) data, wherein the metadata is associated with data associated with other portions of the plurality of column planes, wherein the metadata is mapped to the data by a metadata address based on a portion of the column address, wherein the portion comprises less than all of the plurality of bits.

2. The apparatus of claim 1, wherein the metadata is stored in half of the plurality of column planes.

3. The apparatus of claim 1, wherein a seventh, an eighth, and a ninth bit of the column address indicate a column plane of the plurality of column planes including the metadata mapped to the data of another portion of the plurality of column planes, and a fourth, fifth, and sixth bit of the column address indicate a location of the metadata in the column plane mapped to the data of another portion of the plurality of column planes, wherein the metadata associated with the data of a first eight consecutive column selects of a plurality of column selects is stored in a first column plane of the plurality of column planes and the metadata associated with a second eight consecutive column selects of the plurality of column selects is stored in a second column plane of the plurality of column planes, the metadata associated with the data of a third eight consecutive column selects of the plurality of column selects is stored in a third column plane of the plurality of column planes.

4. The apparatus of claim 1, wherein a seventh, an eighth, a ninth, and a tenth bit of the column address indicates a column plane of the plurality of column planes including the metadata mapped to the data of another portion of the plurality of column planes, and a fourth, fifth, and sixth bit indicate a location of the metadata in the column plane mapped to the data of another portion of the plurality of column planes.

5. The apparatus of claim 4, wherein the metadata is stored in locations of the portion of the individual ones of the plurality of column planes associated with an address where the tenth bit is a first value.

6. The apparatus of claim 4, wherein an address of the column plane associated with the metadata comprises the ninth bit as a most significant bit, the eighth bit as a second most significant bit, the tenth bit as a third most significant bit, and the seventh bit as a least significant bit.

7. The apparatus of claim 4, wherein:

the metadata associated with the data of a first eight consecutive column selects of a plurality of column selects is stored in a first column plane of the plurality of column planes, the metadata associated with a second eight consecutive column selects of the plurality of column selects is stored in a second column plane of the plurality of column planes, the metadata associated with the data of a third eight consecutive column selects of the plurality of column selects is stored in a fifth column plane of the plurality of column planes, the metadata associated with the data of a fourth eight consecutive column selects of the plurality of column selects is stored in a sixth column plane of the plurality of column planes, the metadata associated with the data of a fifth eight consecutive column selects of the plurality of column selects is stored in a ninth column plane of the plurality of column planes, the metadata associated with the data of a sixth eight consecutive column selects of the plurality of column selects is stored in a tenth column plane of the plurality of column planes, the metadata associated with the data of a seventh eight consecutive column selects of the plurality of column selects is stored in a thirteenth column plane of the plurality of column planes, and the metadata associated with the data of a final seven consecutive column selects of the plurality of column selects is stored in a fourteenth column plane of the plurality of column planes.

8. The apparatus of claim 1, wherein the portion of the plurality of column planes storing the metadata is associated with a first column select of a plurality of column selects and the data is associated with other ones of the plurality of column selects.

9. The apparatus of claim 1, further comprising a mode register configured to receive the column address and generate the metadata address.

10. A method comprising:

receiving a column address at a memory device;

generating a metadata address based on a portion of the column address, wherein the portion is less than an entirety of the column address;

retrieving from a memory array of the memory device, metadata associated with the metadata address and additional ECC data associated with a same column select as the metadata;

retrieving from the memory array, data associated with the column address; and providing, from the memory device, the data and the metadata.

11. The method of claim 10, wherein the data is retrieved after the metadata.

12. The method of claim 10, wherein the metadata address is generated by a mode register of the memory device.

13. The method of claim 10, wherein generating the metadata address comprises selecting fourth through ninth bits of the column address as the metadata address.

14. The method of claim 10, wherein generating the metadata address comprises selecting a fourth through tenth bits of the column address as the metadata address.

15. A system comprising:

a plurality of memory devices, wherein each memory device comprises:

a memory array comprising a plurality of column planes, wherein a portion of individual ones of the plurality of column planes are configured to store metadata and additional error correction (ECC) data, wherein the metadata is associated with data associated with other portions of the plurality of column planes, wherein the metadata is mapped to the data by a metadata address based on a portion of a column address comprising a plurality of bits, wherein the portion comprises less than all of the plurality of bits.

16. The system of claim 15, wherein each of the plurality of memory devices is configured to provide one bit of metadata.

17. The system of claim 15, wherein half of the plurality of memory devices are configured to provide one bit of metadata based, at least in part, on the column address.

18. The system of claim 15, further comprising a controller coupled to the plurality of memory devices, wherein the controller is configured to ignore the data, the metadata, or a combination thereof, from one or more of the plurality of memory devices based, at least in part, on the column address.

19. The system of claim 15, wherein the portion of the column address associated with the metadata address comprises six or seven bits.

20. The system of claim 15, wherein a seventh, an eighth, and a ninth bit of the column address indicate a column plane of the plurality of column planes including the metadata mapped to the data of another portion of the plurality of column planes, and a fourth, fifth, and sixth bit of the column address indicate a location of the metadata in the column plane mapped to the data of another portion of the plurality of column planes.

* * * * *